US006375814B1

United States Patent
De Bosscher et al.

(10) Patent No.: US 6,375,814 B1
(45) Date of Patent: Apr. 23, 2002

(54) MAGNETRON WITH PARALLEL RACE TRACK AND MODIFIED END PORTIONS THEREOF

(75) Inventors: Wilmert De Bosscher, Drongen; Hugo Lievens, Gent, both of (BE)

(73) Assignee: Sinvaco N.V., Zulte (BE)

( * ) Notice: Subject to any disclaimer, the term of this patent is extended or adjusted under 35 U.S.C. 154(b) by 0 days.

(21) Appl. No.: 09/673,176

(22) PCT Filed: Apr. 14, 1999

(86) PCT No.: PCT/EP99/02646

§ 371 Date: Feb. 12, 2001

§ 102(e) Date: Feb. 12, 2001

(87) PCT Pub. No.: WO99/54911

PCT Pub. Date: Oct. 28, 1999

(30) Foreign Application Priority Data

Apr. 16, 1998 (EP) .............................................. 98201208

(51) Int. Cl.⁷ ............................................... C23C 14/34
(52) U.S. Cl. ............................... 204/298.21; 204/298.22
(58) Field of Search ........................ 204/298.21, 298.22

(56) References Cited

U.S. PATENT DOCUMENTS 4,525,264 A * 6/1985 Hoffman ................. 204/298.22
5,047,131 A * 9/1991 Wolfe et al. ........... 204/298.22

FOREIGN PATENT DOCUMENTS

DE 41 17 367 A1 * 12/1992 ............ 204/298.22

* cited by examiner

Primary Examiner—Nam Nguyen
Assistant Examiner—Gregg Cantelmo
(74) Attorney, Agent, or Firm—Jack V. Musgrove

(57) ABSTRACT

A sputtering magnetron with a rotating cylindrical target and a stationary magnet assembly (22, 24*) is described, the magnet assembly (22, 24*) being adapted to produce an elongate plasma race-track on the surface of the target, the elongate race-track having substantially parallel tracks over a substantial portion of its length and being closed at each end by end portions (22'), wherein the spacing between the tracks of the race-track is increased locally to materially effect sputtering onto a substrate. The increase in spacing may be at the end portions or along the parallel track portion. The increase in spacing may provide more even erosion of the target beneath the end portions of the race-track, and provide more even coatings on the substrate.

10 Claims, 21 Drawing Sheets

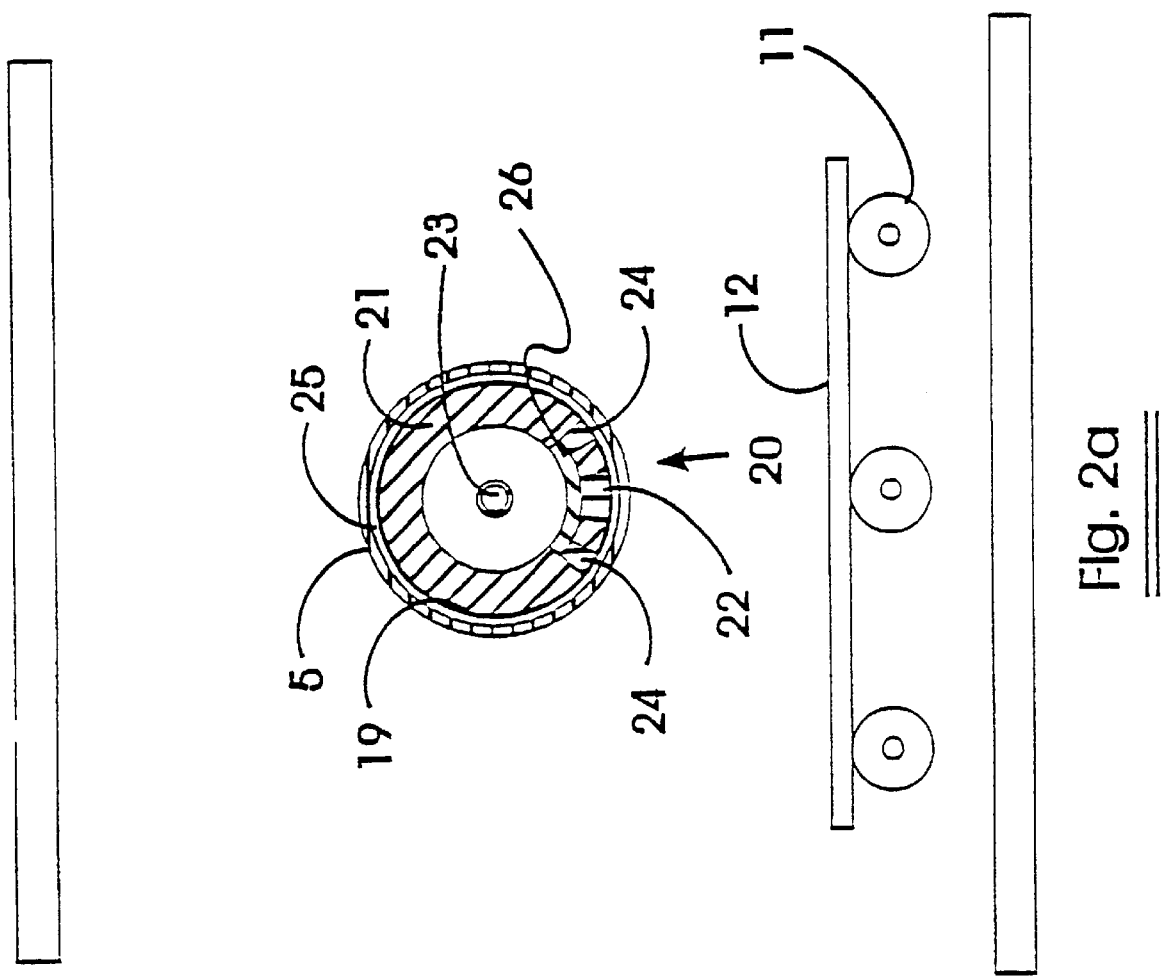

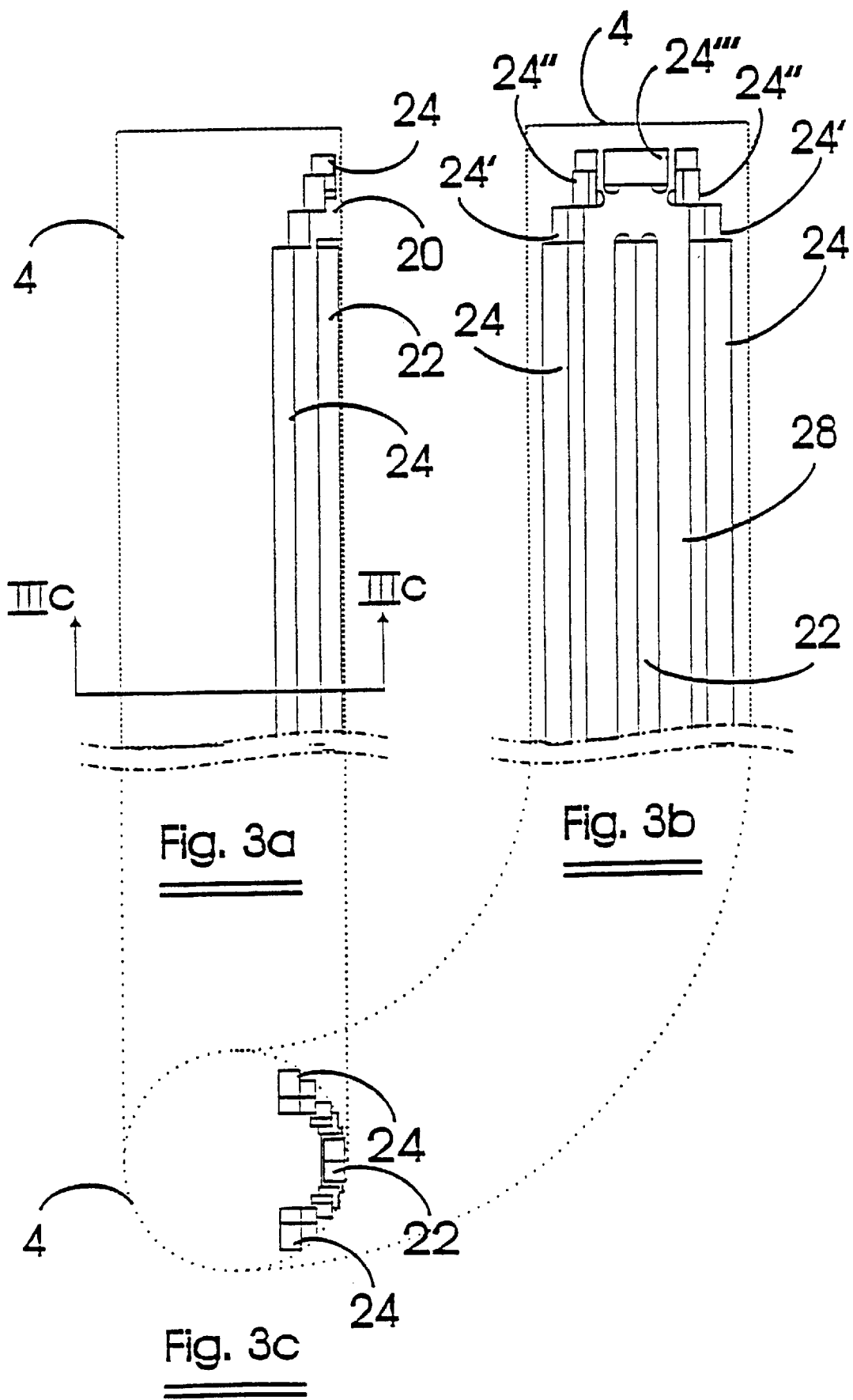

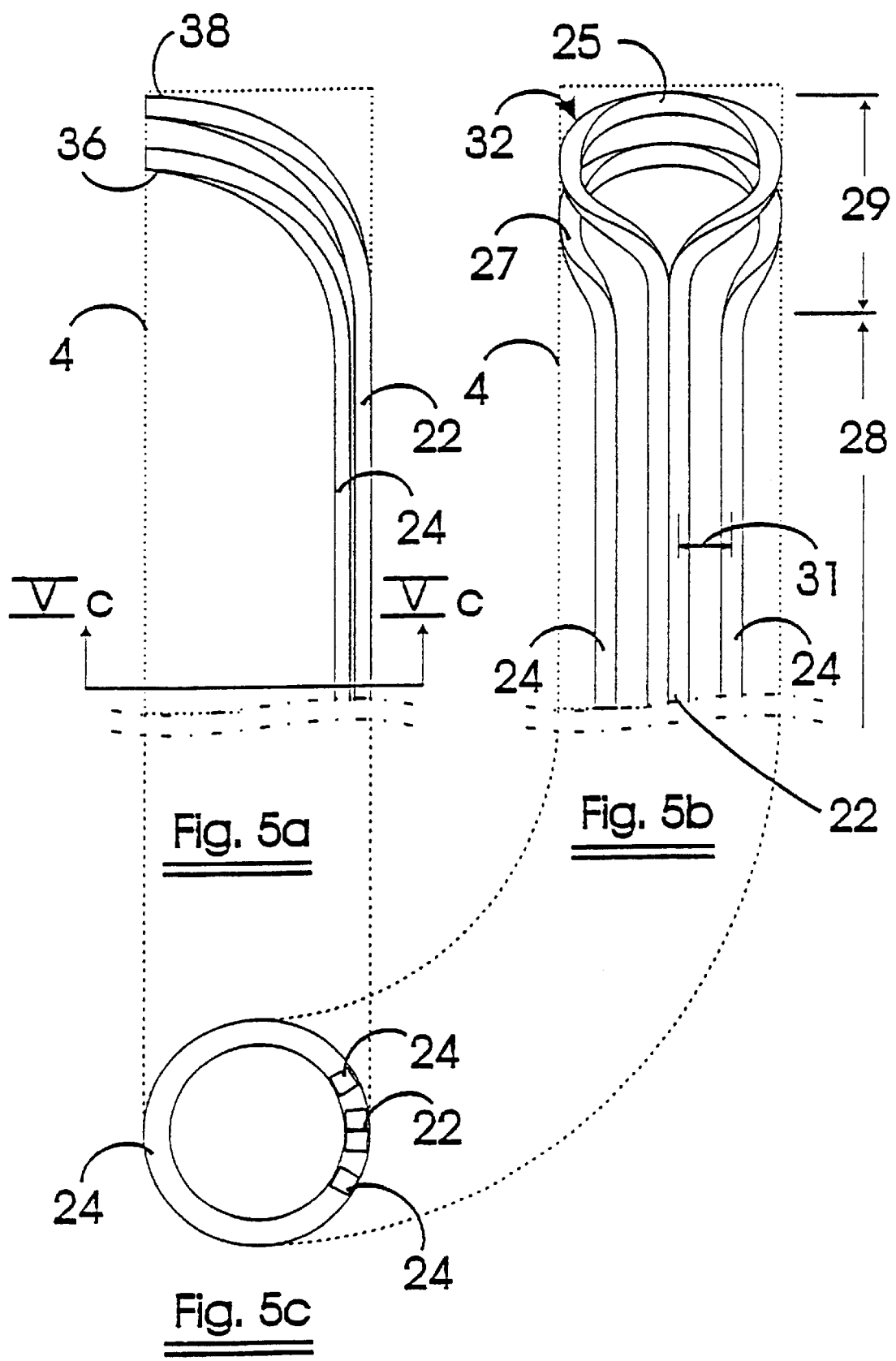

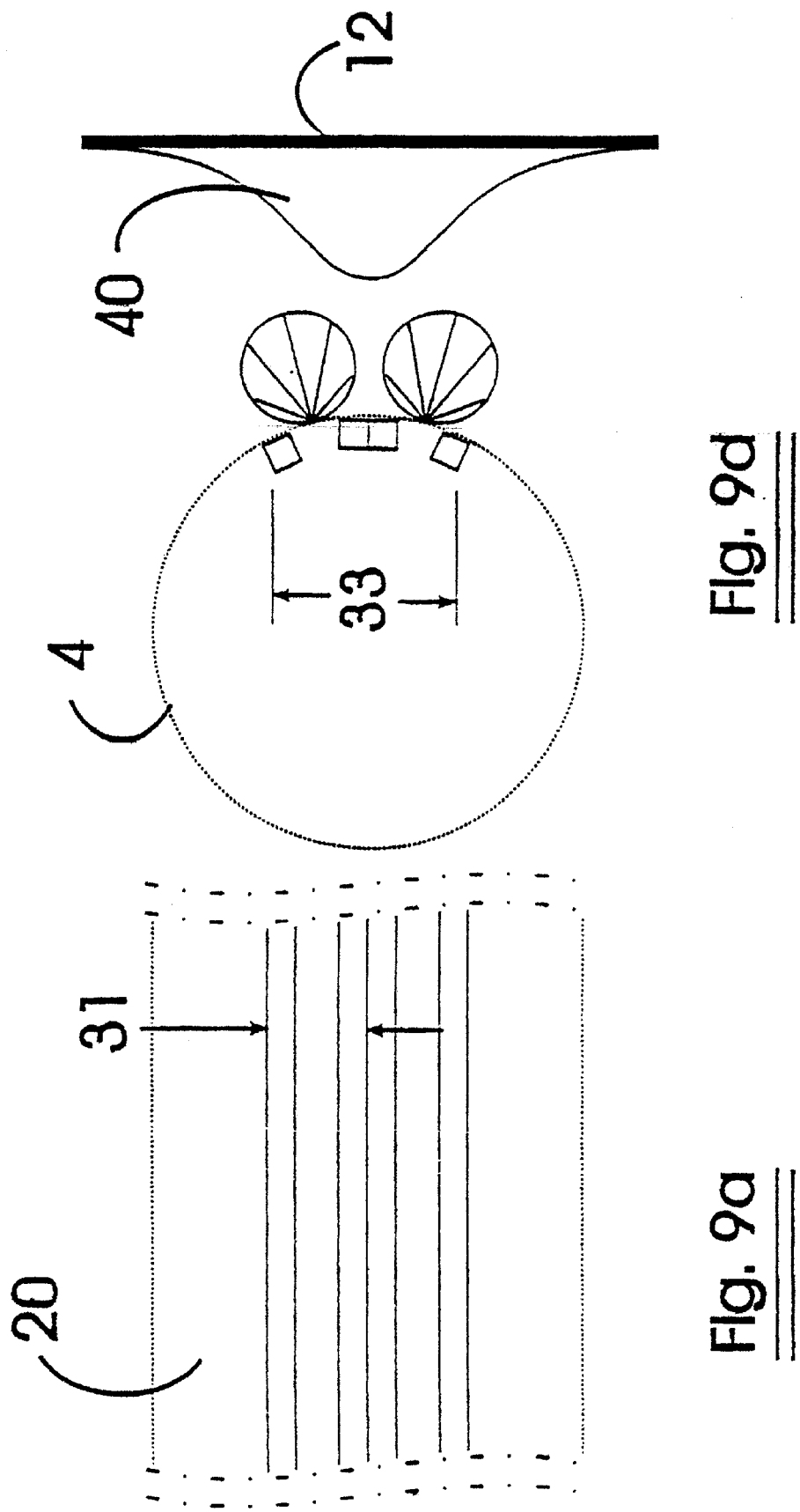

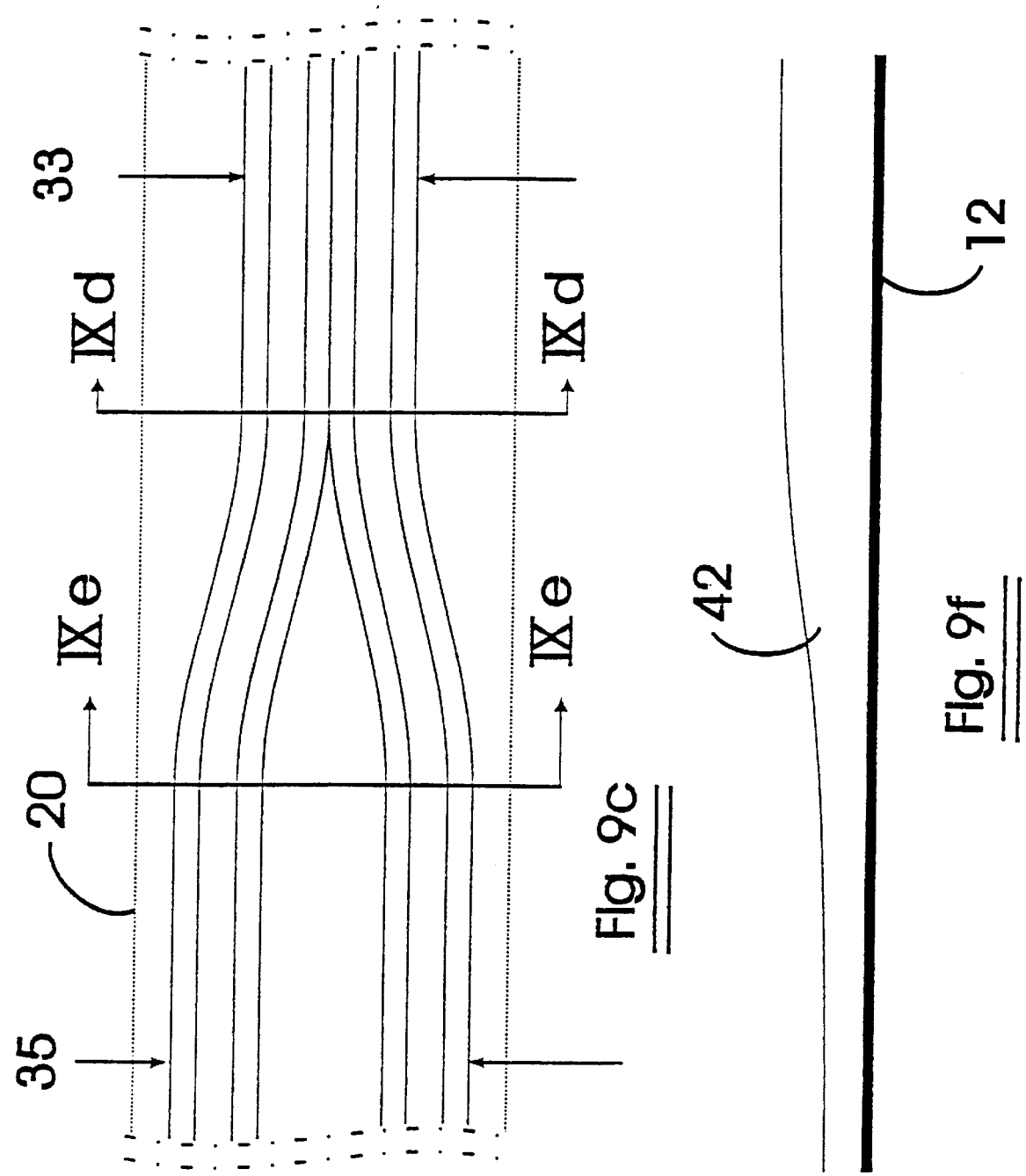

MAGNETRON WITH PARALLEL RACE TRACK AND MODIFIED END PORTIONS THEREOF

The present invention relates to an improved rotating cathode magnetron suitable for sputtering or reactive sputtering of materials from a tubular cathode target onto a stationary or moving substrate as well as a method of operating the magnetron. The magnet assembly of the inventive magnetron is arranged in such a way that local variations in the plasma race-track are generated which may provide novel advantages to the sputtering process. In addition, the novel magnet assembly is particularly suitable for curvilinear arrangements.

TECHNICAL BACKGROUND

In standard non-reactive metallic sputter mode, sputtering with planar magnetrons is known. The most important inconvenience is the formation of a groove of erosion in the target material, whereby this groove, and the plasma generating it, are often referred to as a "race track". The non-uniform erosion profile is inherently associated with the magnet configuration below the target. As a consequence, the target has to be replaced just before the erosion groove depth at any point equals the target thickness. Typically only 30% of the target material is consumed before the target has to be changed which makes it a very costly process because of labour costs, down time as well as the expense of target materials.

During reactive sputtering (i.e. the plasma contains one or more gases that will react with the target material) using planar magnetrons, additional problems of arcing and plasma instability are encountered. Both of these problems have been overcome by the introduction of cylindrical rotating target magnetrons. Firstly, with rotating target magnetrons no race track erosion profile (corresponding to the magnet configuration) is formed and the material consumption on the target can be up to 80%. Secondly, due to the nature of the rotating cathode, less problems and more stable processes are encountered during reactive sputter deposition. Nevertheless, large amounts of material are deposited on shields which are physically located between the target and the substrate to inhibit the deposition of target material on those locations where it is not desired. Therefore, regular cleaning and extensive precautions (e.g. water cooling) have to be foreseen on these shields to reduce the risk of flaking. Flakes of material from shields can contaminate the sputtered surface.

Coating of large substrates in a uniform way during a single passage (i.e. typical condition in glass and web coating), is one of the most critical processes. Control may be obtained by placing additional wedge shaped shields (introducing another source of contaminating particle generation) or by changing the strength of the magnetic field lines (using magnets with different magnetisation or at different distances from the target). The latter solution may introduce non-uniform wear and/or consumption of the target material.

Cylindrical magnetrons have some other disadvantages which are typical for their geometry. The magnets are mounted on a static bar which is located within the rotating cylindrical target tube. The width of the magnet configuration is kept small which means that the turns at the end are quite sharp. Known magnet assemblies do not allow optimal configuration of the magnets in an end turn which results in reduced plasma confinement and increased electron loss at both ends of the target. It is desirable to have the magnets as close as possible to the target tube in order to produce the highest magnetic field strength at the surface of the cathode. In addition, at both ends of the target tube, where the magnets (and the race track) form a U-bend, sore target material is removed. The top of the "U"—bend presents a length of the plasma race-track which remains at the same longitudinal position as the target rotates. This leaves a circular groove round the target tubes at both ends. Eventually, target life is limited by the depth of this groove as it is highly undesirable to deposit the underlying material of the tube onto the substrate.

Rotating cathode sputtering magnetrons with a stationary internal magnet assembly are known, e.g. from U.S. Pat. Nos. 4,422,916, 5,364,518 or WO 96/21750. In particular U.S. Pat. No. 5,364,518 and WO 96/21750 propose magnet assemblies which produce an elongate plasma "race-track" above the target which has a shape comprising a spaced apart pair of parallel straight lengths terminated at each end by end portions or "U" turns. U.S. Pat. No. 5,364,518 proposes controlling target erosion in the end portions by means of widening the track of the race-track in the end positions. As explained in WO 96/21750, the method according to U.S. Pat. No. 5,364,518 has the disadvantage that the wider track of the race-track in the end portions may result in instability of the plasma due to the reduced field strength and resulting electron loss caused by the wider spacing of the magnets. Instead, WO 97/21750 proposes to make the end portions of the race-track "pointed", i.e. to elongate the end portions into an acute angle, e.g. triangular or to make them semi-elliptical or parabolic in form. The disadvantage of making the end portions pointed, in particular triangular in shape is that the radius at the point is very small. This results in a high loss of electrons as they attempt to navigate this tight bend. To achieve reduce electron loss it may be considered to increase the magnetic field in this position in order to bind the electrons more closely to the track. However, increasing the magnetic field increases the plasma density and hence, the target erosion. Further, although WO 97/21750 proposes sophisticated geometrical shapes for the end portions of the race-track, e.g. parabolic or semi-elliptic, the only disclosed method of producing such refined track geometries is the use of discrete sections of magnets, the so-called "lumped" magnet method. It is not possible to accurately tailor the race-track to a sophisticated geometric form such as a parabola by means of lumped magnets—the steps between the magnets generate a castellated appearance which bears little relationship to a smooth curve (see FIG. 3 in the following).

U.S. Pat. No. 5,645,699 describes the use of anodes to influence the deposition rate onto the substrate during reactive sputtering. This known method starts from the assumption that there is inevitable loss of electrons in the turns at the end of the race-track.

The present invention has the object of providing a sputtering magnetron and a method of operating the same which provides improved control over sputtering performance.

A further object of the present invention is to provide a sputtering magnetron and a method of operating the same which provides improved uniformity of erosion at the ends of the target.

Still a further object of the present invention is to provide a sputtering magnetron and a method of operating the same which provides improved uniformity of deposition onto the substrate.

Another object of the present invention is to provide a sputtering magnetron and a method of operating the same which provides a plasma race-track with reduced loss of electrons in the end portions thereof.

Yet a further object of the present invention is to provide a sputtering magnetron and a method of operating the same which provides improved target utilisation while allowing novel and useful ways of altering the coating sputtered onto the substrate.

SUMMARY OF THE INVENTION

The present invention may provide a sputtering magnetron with a rotating cylindrical target and a stationary magnet assembly, said magnet assembly being adapted to produce an elongate plasma race-track on the surface of said target, said elongate race-track having substantially parallel tracks over a substantial portion of its length and being closed at each end by end portions, wherein the spacing between the tracks of said race-track is increased locally to materially effect sputtering onto a substrate.

The present invention also includes a method of operating a sputtering magnetron with a rotating cylindrical target and a stationary magnet assembly, comprising the steps of: generating an elongate plasma race-track on the surface of said target using said magnet assembly, said elongate race-track having substantially parallel tracks over a substantial portion of its length and being closed at each end by end portions, and increasing the spacing between the tracks of said race-track locally to materially effect sputtering onto a substrate.

The present invention may provide the advantage that the requirement for shields can be substantially reduced. As a consequence, the cost and time consuming maintenance of these shields can be lowered, while their detrimental effect on process and product quality can be minimised. This property can be achieved by reducing the unwanted deposition of material in the region between the target and the substrate. Though excess material is still brought into the vacuum system, it can be gathered at non-critical locations, e.g. on shields between the target and the chamber walls. These shields have no direct relation with the substrate and so require less precautions, less maintenance and have no effect on the process or film quality.

In addition, shields may no longer be needed to control the film thickness uniformity over (large) substrates. In addition, the current technology of changing magnet strengths and distances, resulting in non-uniform consumption of the target material can be overcome. Precise control of sputter efficiency towards the substrate for any desired position on the substrate can be obtained with the present invention, while maintaining uniform erosion of the cylindrical target tube. This means that standard tubes can be used for every possible uniformity of erosion profile.

Furthermore, the present invention allows freedom in the configuration of the magnet assembly. The U-turns at the end of the target tube can be defined freely, allowing better control of the magnetic field. Therefore, plasma configurations in the turns and on straight zones can be achieved with which the loss of electrons is reduced. The radius of the U-turns can be varied even to values larger than the diameter of the target tube. In addition, in accordance with the present invention, the direction of manetic field adjacent the magnet assembly may be arranged perpendicular to the target surface, allowing the creation of the largest possible magnetic field strength on the target surface. Likewise, the top surface of the magnets in the magnet assembly may be arranged parallel to the target tube which enables the closest possible positioning with respect to the target, giving the largest possible magnetic efficiency.

The circular erosion groove at the end of the target tube (due to the U-turns) known from conventional devices can be reduced and in some cases even be eliminated. A spoon or elliptical (i.e. more than semi-elliptical) shape is preferred for the race-track in the end zones in accordance with one embodiment of the present invention. Even old and worn targets, for which the groove is so deep that the underlying material becomes visible, can be used again without the risk of depositing the wrong material on the substrate.

In accordance with the present invention simultaneous metal and reactive sputtering can be achieved when the race-track is arranged to traverse the back side of the cathode.

The present invention also includes a sputtering magnetron having a magnet assembly and a target, said magnet assembly being adapted to produce a curvilinear plasma race-track on the surface of said target, said magnet assembly including: a first section for generating a magnetic field associated with a first magnetic polarity; a second section being spaced from said first section and generating a magnetic field associated with a second magnetic polarity, said first and second sections defining a magnetic field suitable for enclosing said curvilinear race-track; wherein one of the first and second sections includes at least one magnet and the other of said first and second sections is terminated by a soft magnetic material forming a magnetic circuit with said magnet. By the termination of the second section is meant that the second section defines the magnetic pole which is the interface between magnetic material and non-magnetic material, i.e. the atmosphere above the magnet array and the target.

The dependent claims define separate embodiments of the invention. The present invention, its embodiments and advantages will now be described with reference to the following drawings.

BRIEF DESCRIPTION OF THE DRAWINGS

FIGS. 2a and 2b show details of the magnetron of FIG. 1.

FIGS. 3a to 3c show schematic respectively side, top and end representations of a conventional magnet assembly.

FIGS. 5a to 5c show schematic respectively side, top and end representations of a magnet assembly in accordance with another embodiment of the present invention.

FIGS. 9A to 9C show schematically a magnet assembly in accordance with another embodiment of the present invention.

FIGS. 9D to 9F show the deposition profiles on the substrate achieved with the assembly shown in FIGS. 9A to 9C.

DESCRIPTION OF THE ILLUSTRATIVE EMBODIMENTS

The present invention will be described with respect to particular embodiments and with reference to certain drawings but the invention is not limited thereto but only by the claims. The drawings described are only schematic and are non-limiting.

Figure 1:
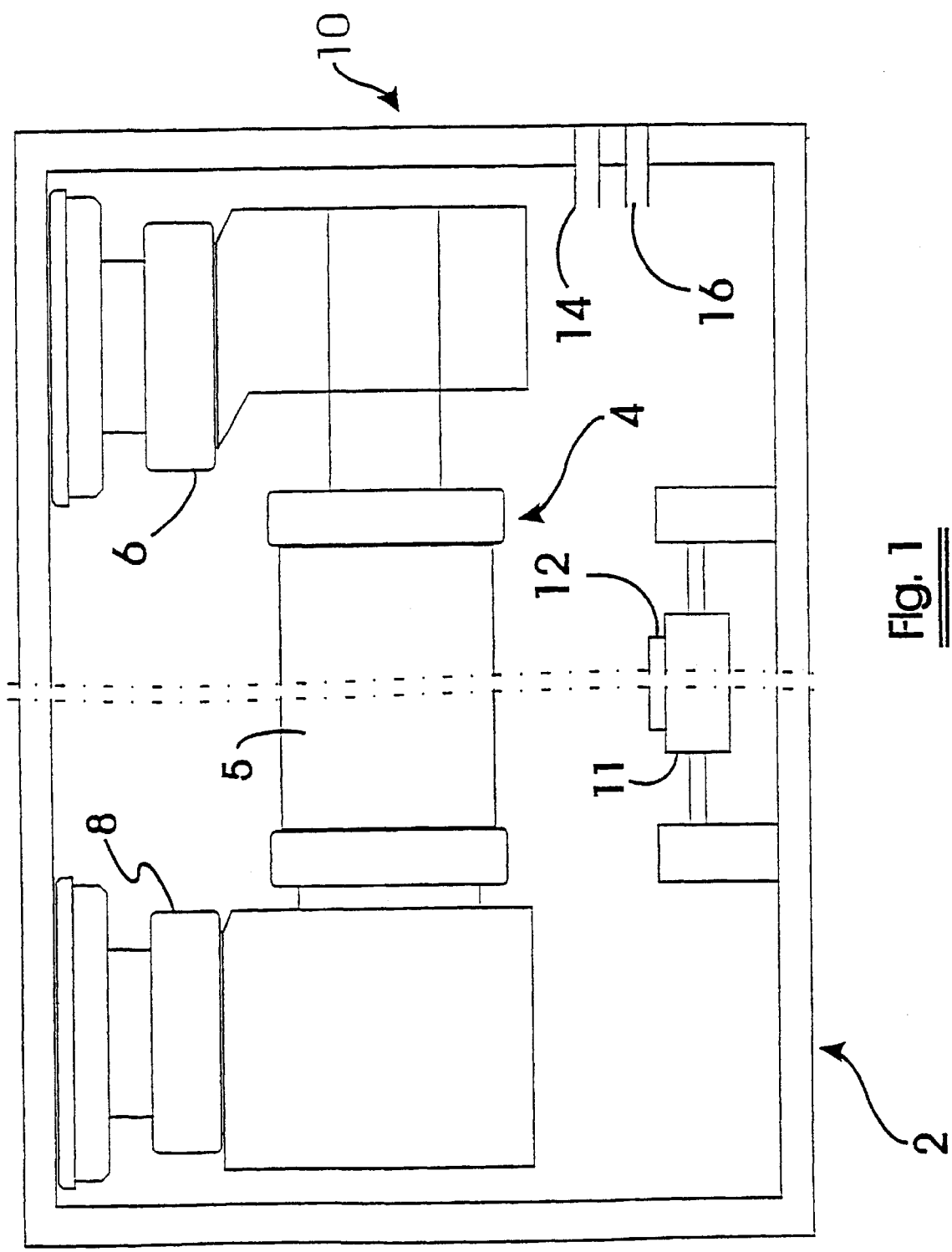
FIG. 1 is a schematic representation of a rotating cathode sputtering magnetron in accordance with the present invention.
Figure 2B:
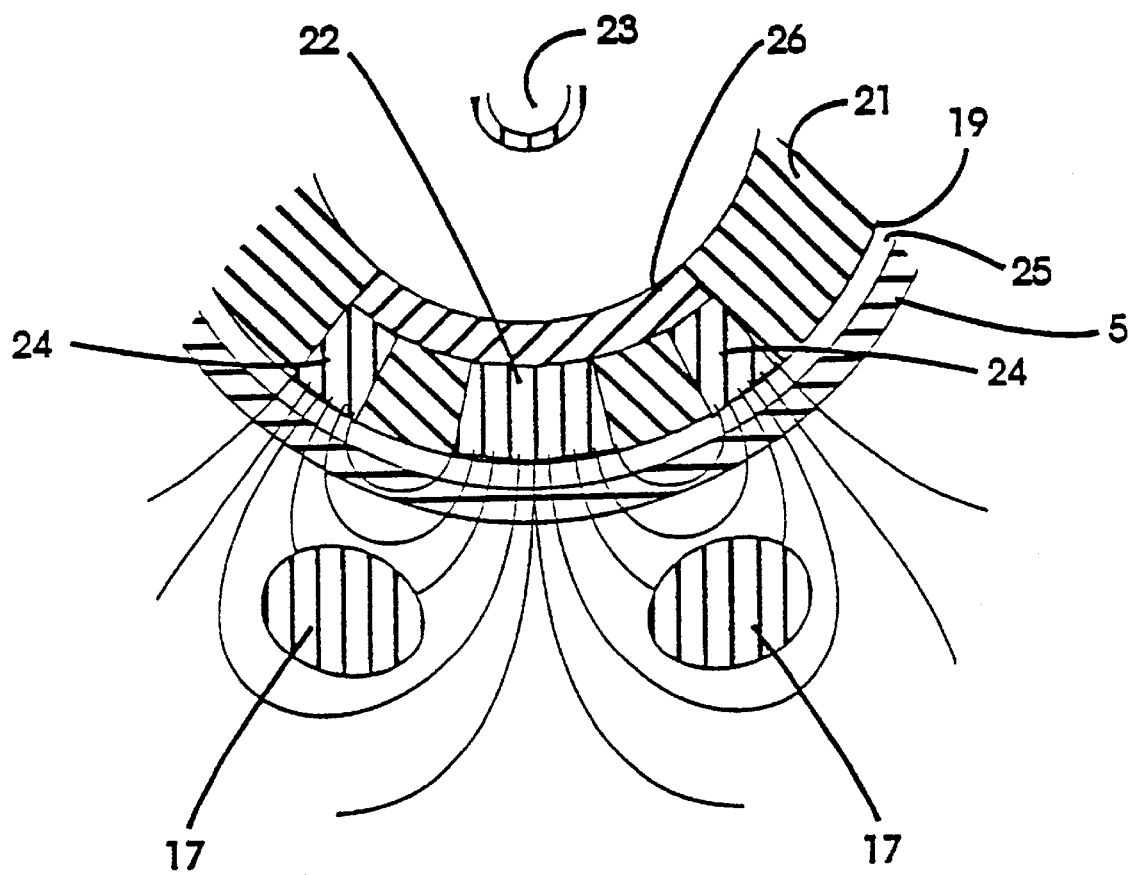

FIGS. 1 and 2a and 2b are schematic views of the sputtering magnetron 10 in accordance with the present invention. FIG. 1 is a schematic side view of the target 4 within the vacuum chamber 2, whereas FIG. 2a is a schematic cross-sectional view through the target 4. FIG. 2b is an enlarged view of a part of the target 4 from FIG. 2a. Vacuum chamber 2 preferably includes a removable, cylindrical rotating target 4. The target 4 may be driven by any suitable drive means, e.g. an electric or hydraulic motor or similar linked to the target 4 through a feed-through 6. The other end of the target 4 may be supported by a further feed-through 8 through which cooling liquid for the target 4 and an electrical supply (not shown) may be brought into chamber 2. The target 4 may be a tube made from the material to be sputtered or may have on its outer surface a separate layer 5 of material to be sputtered. The target 4 is generally held at a negative potential by a voltage supplied through feed-through 8. Typical target materials may be, for example only, titanium or silicon. A substrate 12 to be sputtered is arranged adjacent the target 4. The substrate 12 may be stationary or may be a continuous sheet of material moved past the target 4, e.g. driven by rollers 11. Typical substrate materials may be, for example only, sheet glass, plastic web or sheet metal. The vacuum chamber 2 may also include means 14 for introducing an inert gas such as argon as well as means 16 for introducing further reactive gases e.g. Nitrogen or oxygen for reactive sputtering. Further, there may be more than one substrate 12 and more than one target 4 within the chamber 2.

A generally stationary magnet assembly 20 is arranged within the cylindrical target 4. The magnet assembly 20 may be made up of a collection of individual magnets 22, 24 arranged in a given pattern or may in accordance with one aspect of the present invention include magnets forming one polarity and a specially shaped soft magnetic material forming the other polarity. Generally, a central row or rows of magnets 22 having one polarity towards the target layer 5, e.g. north poles, is surrounded by a closed loop of either a soft magnetic material or magnets 24 which have the opposite polarity towards the target 4, e.g. south poles. The magnets 22, 24 may advantageously be arranged on a soft magnetic former 26 as a keeper, which former 26 may advantageously be tubular or part of a tube. Further, magnets 22, 24 may be preferably inserted into a plastic tube 21 which prevents oxidation of the magnets 22, 24 and surrounded by a further tube 19 to prevent contact with cooling fluid.

In operation, the intense magnetic field 17 generated by the magnets 22, 24 just above the target material 5 in combination with the crossed electrostatic field between the target 4 and the substrate 12 generates a closed loop of plasma discharge which sputters material from the surface 5 of the target 4 towards the substrate 12. Heat generated by the sputtering is removed by a cooling circuit, e.g. cooling fluid circulated through a space 25 below the target layer 5 and supplied by a central tube 23. For conventional metal sputtering or for reactive sputtering, a vacuum of $10^{-2}$ to $10^{-4}$ mbar is preferably maintained in the vacuum chamber 2.

In accordance with the present invention, the magnet assembly 20 of a sputtering magnetron 10 with a rotating cylindrical target 4 is adapted to produce an elongate plasma race-track on the surface of the target 4 (see FIG. 11A), the elongate plasma race-track having substantially parallel tracks over a substantial portion of its length and being closed at each end by end portions, wherein the track spacing of the race-track is varied locally to materially effect sputtering onto a substrate.

A conventional magnet configuration in a rotating magnetron is depicted in FIG. 3 for comparison as is known for instance from WO 97/21750. The drawing shows only one end of the target tube 4, the other end has a similar arrangement. The central magnets 22 (shown as a double bar) have the opposite magnetisation direction with respect to the surrounding magnets 24, 24', 24" and 24'". The magnetic field distribution obtained includes a substantially parallel central portion 28 and the magnets 24', 24", 24'" nearest to the tube end create the closed end loop 29. FIG. 3b is a schematic top view of the magnet array 20. The magnet array 20 is shown as including continuous straight magnets 22 however it should be understood that the magnet array 20 may be made up of a series of individual magnet blocks arranged in a line which may be called a "lumped" magnet array. The lumped magnets 24', 24", 24'" create a magnetic field which includes series of steps and approximates a smooth curve such as a parabola or semi-ellipse very badly. FIG. 3A shows a longitudinal cross-sectional schematic representation of the conventional magnet array 20. The outer loop formed by magnets 24', 24", 24'" appears offset with respect to the inner magnets 22 because of the curvature of the cylindrical support of the magnet array 20 (not shown). FIG. 3C is a schematic cross-sectional end view through the target tube 4.

Examples of the magnet assembly in accordance with the present invention will be described with reference to FIGS. 4 to 11. In FIGS. 4 and 5, the end portions 29 of the magnet array 20 are increased in diameter 34 compared with the width 33 of the substantially parallel central portion 28. This can be used to control the erosion of the target 4 in the end regions. In FIG. 9 the spacing 35 of the magnet array 20 in a section of the parallel central portion 29 is increased. This chances the direction of sputtering locally which may be used to produce special effects, e.g. reducing the thickness of the coating sputtered onto a substrate 12. In FIG. 10, the local spacing of end portions 29 of the magnet array 20 has been increased locally to alter the amount of material sputtered to the substrate 12 from the corresponding zones of the target 4.

Figures 4A, 4B, 4C:
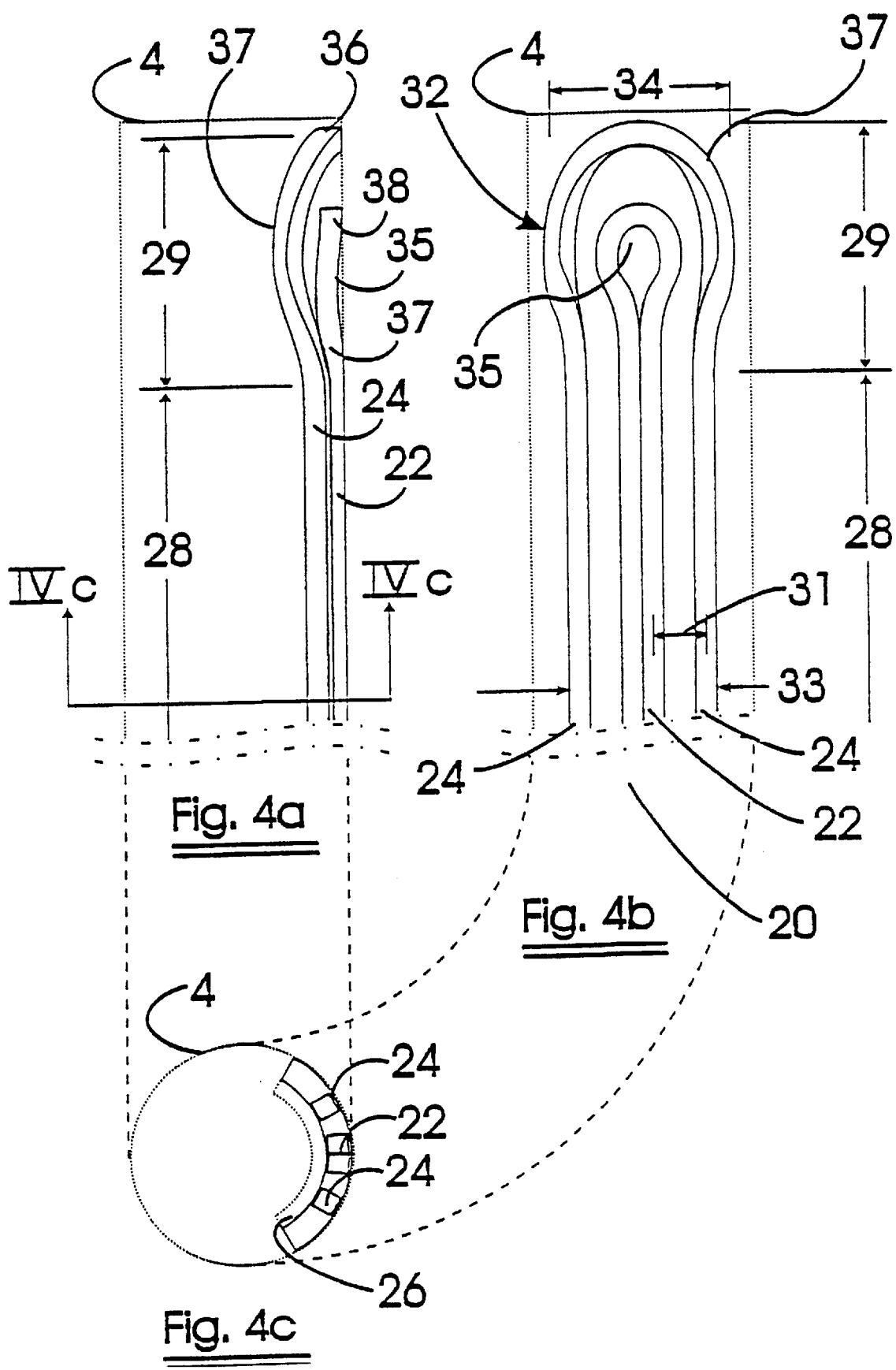
FIGS. 4a to 4c show schematic respectively side, top and end representations of a magnet assembly in accordance with an embodiment of the present invention.

In FIGS. 4a–c only one end of the target tube 4 is shown, the other end may have a similar or a different arrangement.

FIG. 4 is a schematic idealised representation of a magnet assembly 20 in accordance with one embodiment of the present invention. The central magnets 22 (shown as a double bar) have the opposite magnetisation direction (e.g. north poles towards the target) with respect to the surrounding magnets 24. The magnetic field distribution obtained includes a substantially parallel central portion 28 and the magnets nearest to the tube end create the closed end loop 29. FIG. 4B is a schematic top view of the magnet array 20 in accordance with one embodiment of the present invention. The magnet array 20 is shown as a continuous line 22, 24, however it should be understood that the magnet array 20 may be made up of a series of individual magnet blocks or may include a specially shaped soft magnetic material as one polarity or both polarities. FIG. 4A shows a longitudinal cross-sectional schematic representation of the magnet array 20. The magnets 22, 24 of the magnet array 20 are arranged close to the inner diameter of the target tube indicated by 4. The magnets 22, 24 may advantageously be mounted on a soft magnetic tube 26 (shown best in FIG. 4c) or part of a tube, e.g. pure iron or mild steel. The inner magnets 22 form a loop 25 at the end 29 which may have a diameter larger than or equal to the width of the double bar towards the centre of the target 4. Loop 25 may be replaced by a single magnet in the same position (not shown) having a shape identical to the shape of the loop 25. The outer magnets 24 also form a loop 27 at the end of a parallel central section 28. Loop 27 may have a diameter 34 larger than or equal to the width 33 of the central section. The spacing between the outer magnets 24 and the inner magnets 22 in the central substantially parallel region is indicated by 31. The spacing 32 of the outer loop 27 and the inner loop 25 of magnets 24, 22 in the end loop region 29 may be equal to the spacing 31 or may be different, e.g. greater, and may vary around the loop region 29. In accordance with the present invention the spacing 32 and the diameter 34 may be arranged with a specific relationship to each other in order to improve the uniformity of the erosion of the target 4.

Due to the curvature of the target 4, portions 35 and 37 of the outer and inner loops 27, 25 in FIG. 4a appear offset with respect to the central and end portions 22, 24, 36, 38 thereof FIG. 4C is a cross-sectional end representation through the target tube 4 showing the former 26.

FIGS. 5a–c show an alternative embodiment of the present invention. The reference numbers in FIG. 5 which are the same as those in FIGS. 4a–c represent similar components. In this embodiment, the inner and outer magnets 22, 24 in the end portion 29 extend around the inside of tubular target 4 so that the portions 36 and 38 of the outer and inner loops 27, 25 extend to the rear of the target away from the substrate 12. The effect of this magnet arrangement is that the plasma race-track follows the magnets 22, 24 around the back of the target, extending away from the substrate 12 resulting in target material being sputtered onto the inside of the vacuum chamber 2 rather than onto the substrate. In accordance with the present invention, the end loops 25, 27 may be set at any position between the two extremes shown in FIGS. 4 and 5.

Figure 6:
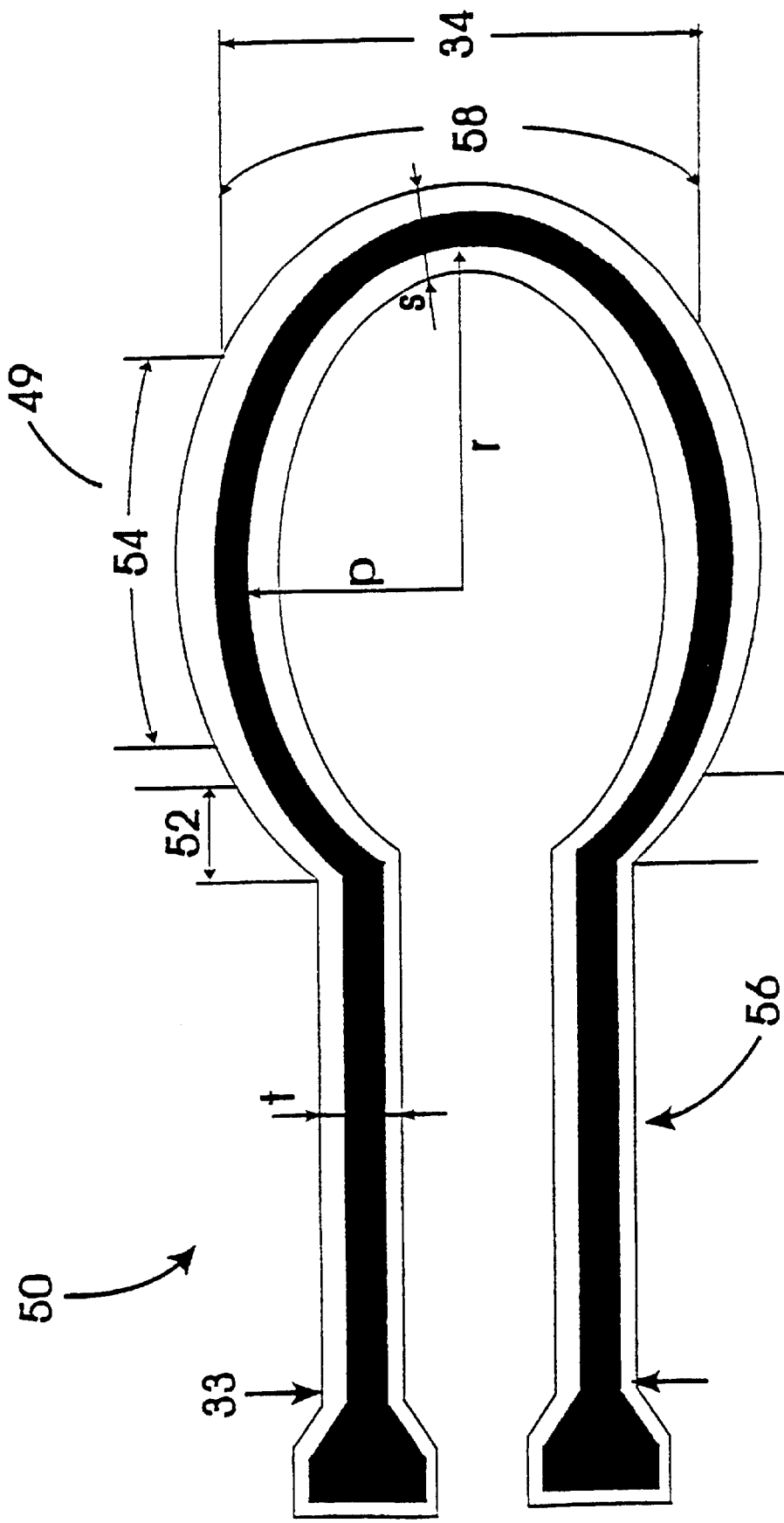
FIG. 6 shows an idealised race-track in an end-turn in accordance with an embodiment of the present invention.

An application of the embodiments shown in FIGS. 4a–c and 5a–c will be described with reference to FIGS. 6 to 8. FIG. 6 shows a schematic representation of the end loop 49 of a plasma race-track 50 in accordance with the present invention. Magnets 22, 24 are arranged as shown in schematically in FIG. 4 or 5 to produce the plasma race-track 50. The end loop 49 may comprise three zones. A transition zone 52 may be provided between the central parallel portion 56 of the race-track and the end of loop 49. This transition zone 52 may include graceful swan-neck transitions on both sides of the race-track 50 avoiding sharp corners or changes of direction. Transition zones 52 may be dispensed with if the transition from the mid-zones 54 to the substantially parallel central section 56 of the race-track track 50 is small. The mid-zones 54 may be approximated by arcuate sections. An end zone 58 which may be approximated by an arcuate section. joins the mid-zones 54 together. The width of the track "s" of the race-track 50 may vary around the end loop 49 but in accordance with the present invention this width "s" will be approximated as a constant width at least in the end zone 58. The width of the track of the race-track varies in the mid- and transition zones 54, 52 smoothly from "s" in the end zone 58 to the width "t" in the central section 56 of the race-track 50. It will be assumed that, at least approximately, the arcuate sections of the mid- and end zones 54, 58 join tangentially, i.e. without discontinuity. Further, it will be assumed that the race-track form provided by the transition zones, mid-zones and end zones, 52, 54, 58 may be approximated to an ellipse with a parallel radius "r" and a perpendicular radius "p". As is well known an ellipse may be represented by the formula:

$$I = x^2/r^2 + y^2/p^2$$

where y is the vertical axes and x the horizontal one.

It will be understood by the skilled person that these approximations are made to define the present invention and that the present invention includes plasma race-tracks and their corresponding magnet arrays which achieve the same effects as will be described for the present invention even if the magnet array and the corresponding plasma race-track differs somewhat from the idealised representation shown in FIG. 6.

In accordance with the present invention it has been determined that for particular relationships between "r", "s" and "p" in combination with magnet strengths and materials as well as the distance the magnets are placed from the target, the erosion of the target around end loop 49 may be substantially uniform. Substantially uniform in accordance with the present invention means less than 20% differences in target erosion around the end loop 49 and between the end loop 49 and the central portion 56 of the race-track. The present inventor has determined the surprising fact that there are combinations of "r", "s" and "p" in combination with the magnet strengths and materials and the distance from the magnets to the target with which the radii in the end loop 49 can be relatively large and the field strength sufficiently high making it easier for the electrons to traverse the curve without exiting from the plasma while still being able to keep the magnetic field in these curves such that the target erosion depth can be controlled. Due to the use of gentle curves with large radii in the turn region 49 combined with a change in track width of the race-track in the turn and/or a reduction in the intensity of the magnetic field, the erosion is not only uniform but also the electron loss is reduced to a minimum.

Figure 7A:
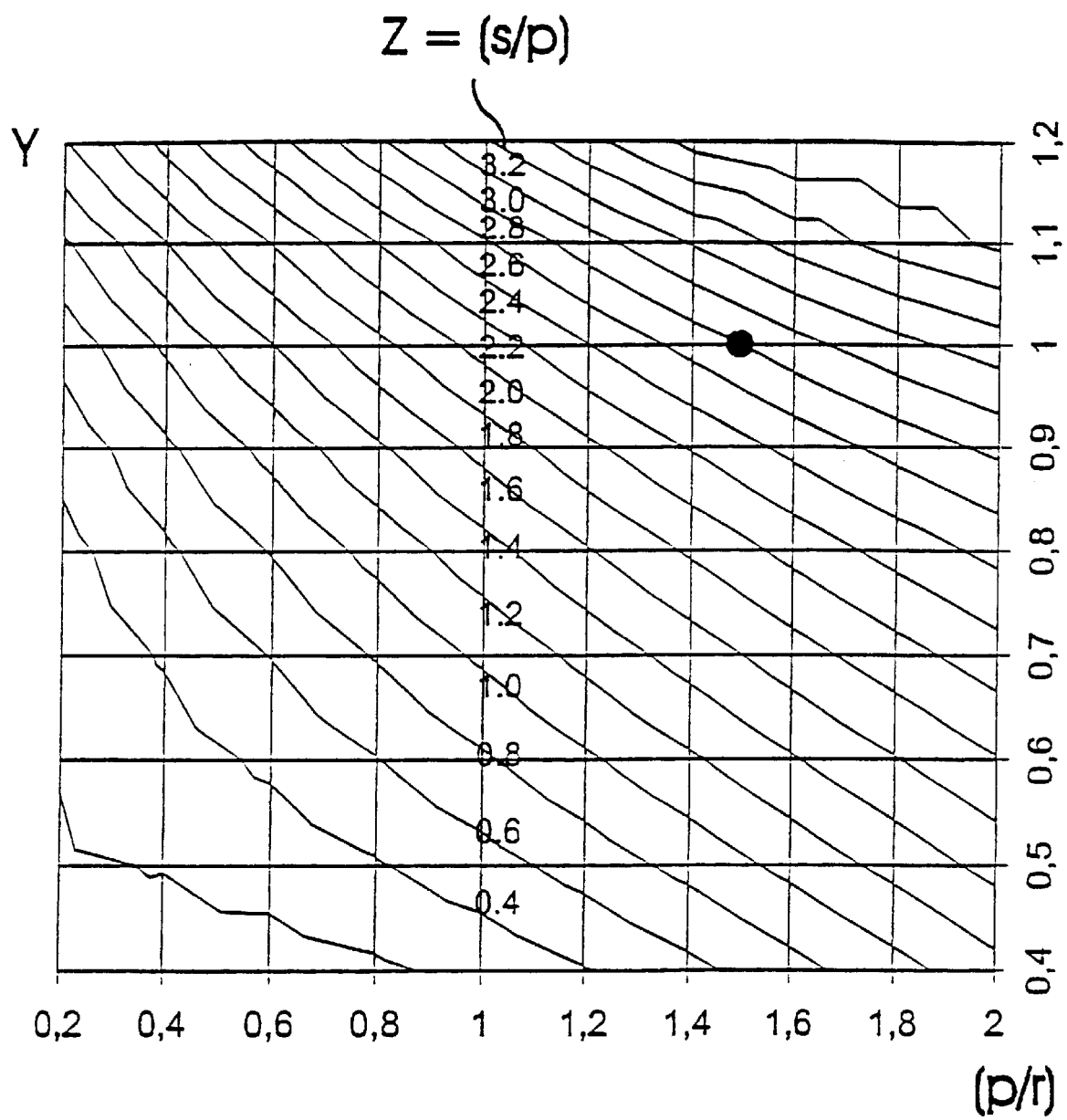
FIGS. 7A and 7B show graphs defining relationships to provide an erosion depth in the end turns of a magnetron in accordance with the present invention which is less than 20% greater than the erosion depth in the parallel central section.
Figure 7B:
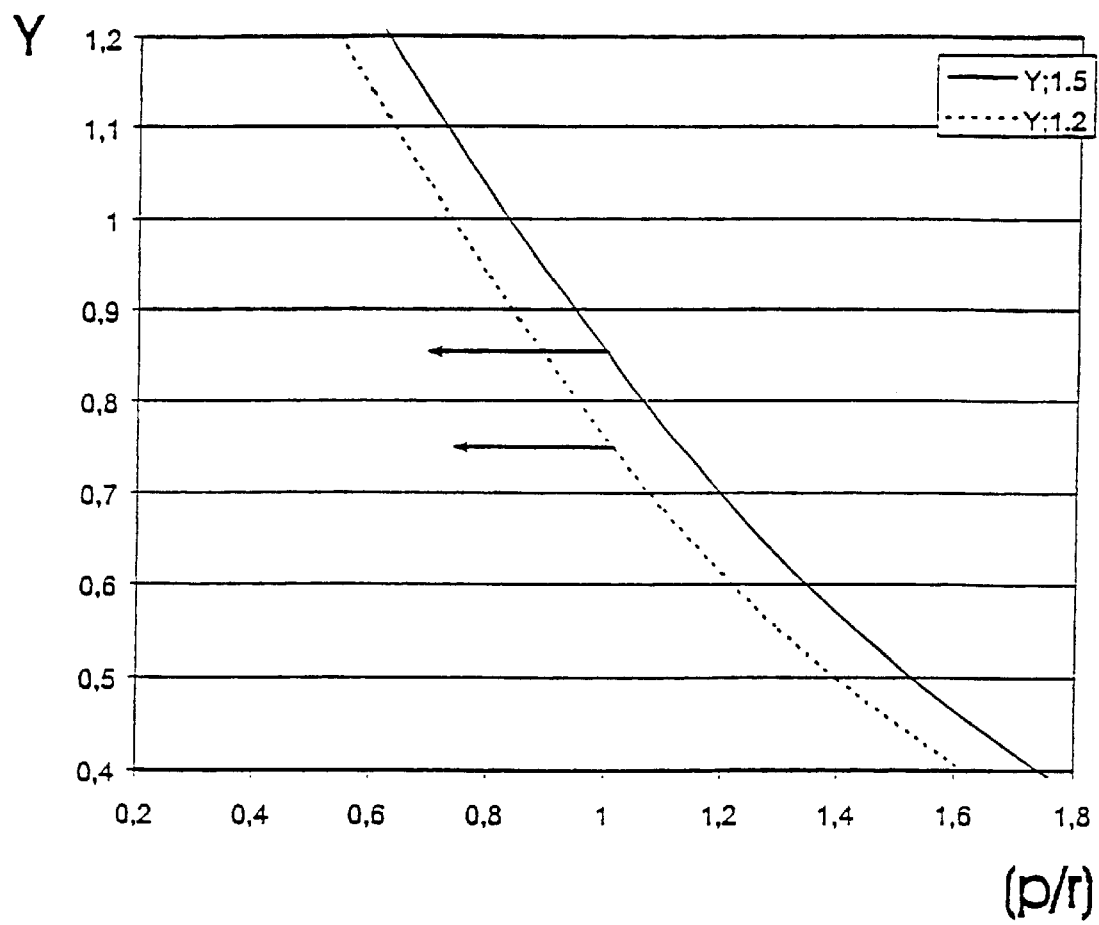
Figure 8A:
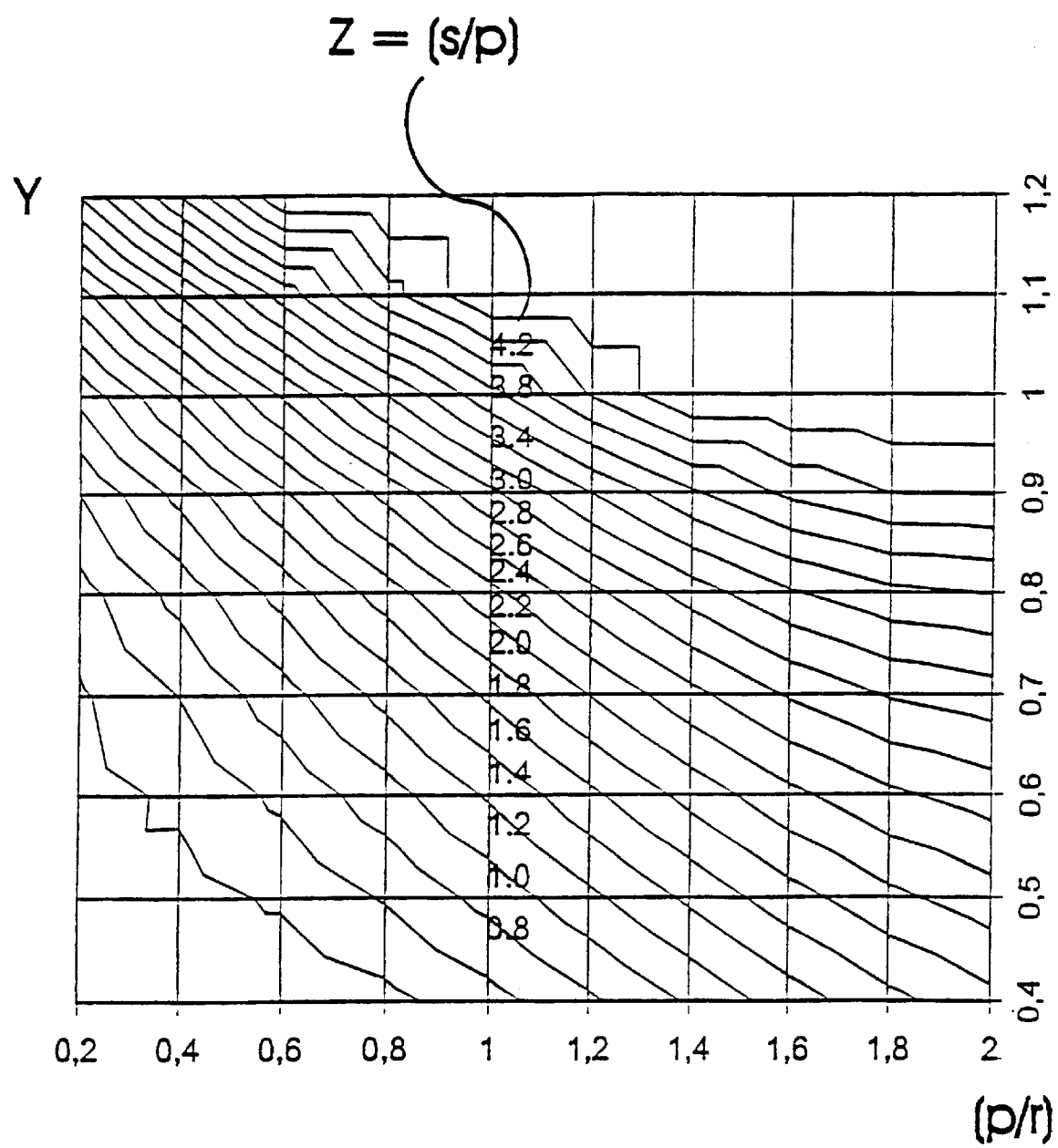
FIGS. 8A and 8B show graphs defining relationships to provide an erosion depth in the end turns of a magnetron in accordance with the present invention which is the same as the erosion depth in the parallel central section.
Figure 8B:
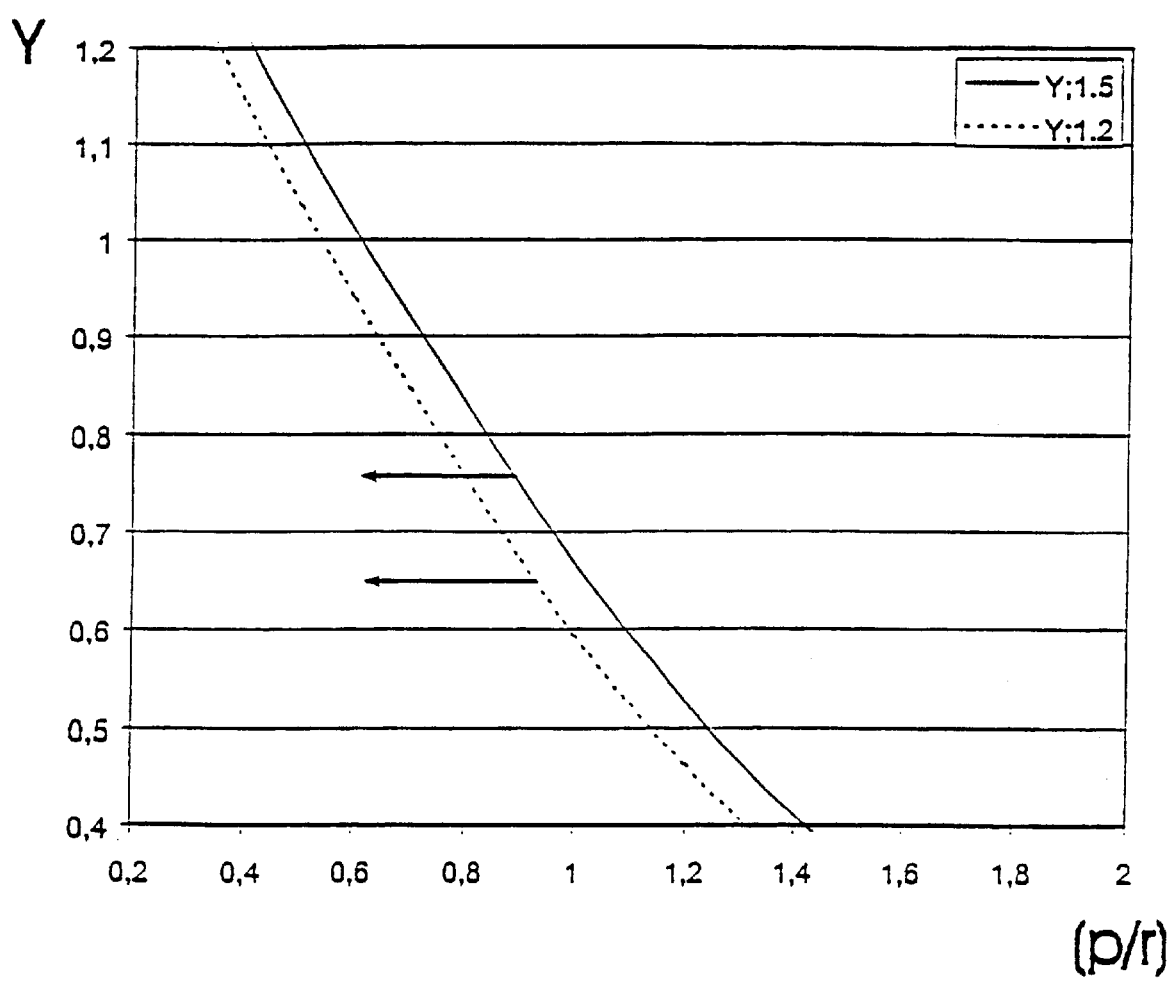

FIGS. 7A and B show certain limiting results for a maximum of 20% difference in erosion depth around the end portion 49 of the race-track or between the end portion 49 and the substantially parallel central section 56, i.e. 20% difference or less (down to no or 0% difference) which is "substantially uniform erosion" in accordance with the present invention. FIGS. 8A and 8B show similar graphs for 0% difference in target erosion. The "y" axis in FIGS. 7 and 8 relates to the average target erosion rate per unit width of erosion groove compared to the parallel centre section (1=the same rate per unit width as in the central section). The "x" axis is the ratio of p/r for the elliptical approximation of FIG. 6. The third (z) dimension in FIGS. 7A and 8A is representative of the width of the target erosion profile "s" (similar to but not the same as the magnet spacing). It has been found by the present inventor that the width of the race-track in the turn which gives substantially uniform erosion is given by z x p as an approximation. As an example from the graph FIG. 7A, if the ratio of groove erosion per unit groove width (y axis) is 1 (i.e. the erosion rate per unit groove width in the turn is the same as in the parallel central region), and the ratio of p/r is 1.5, the z co-ordinate is 2.8. Accordingly, the erosion groove width in the centre of the turn should be set to z.p=2.8p or 4.2r to obtain substantially uniform erosion.

The graphs of FIGS. 7A and 8A, therefore, define iso-erosion surfaces, i.e. those of relatively uniform erosion. Any co-ordinate lying in or between the iso-erosion surfaces defined in FIGS. 7A and 8A will provide an erosion depth within the range+20% and 0% compared to the erosion depth in the central parallel section of the race-track, i.e. end turns with a substantially uniform erosion in accordance with the present invention.

As explained above it is preferred in accordance with the present invention if there are only gradual changes in the race-track direction in the end portion 49. A very large or small p/r ratio means that the electrons in the plasma must follow a rapidly changing path including tight bends which is conducive to loss of electrons from the plasma. It is preferred if the ratio of p/r is less than 2. It is also preferred if the erosion groove width is less than 1.5r, more preferably less than 1.2r. Substituting the erosion groove width=z.p, these restrictions result in the dimension z being preferably smaller than 1.5r/p and more preferably 1.2r/p. These limits are shown in FIGS. 7B and 8B. The right hand solid line relates to the restriction z≦1.5r/p and the left hand dotted line relates to z≦1.2r/p. FIGS. 7A, B and 8A, B have the same x and y axes—in FIGS. 7B and 8B the details of FIGS. 7A and 8A have been omitted for clarity purposes. These restrictions may also place a maximum on p/r of about 1.75. It is more preferred if the ratio of p/r is less than 1.5, and it is also preferred if p/r approaches about 1, i.e. close to a circle. Further, the larger the value of r/p the longer the end loop 49 becomes. thus taking up space at the ends of the target and making the design of the magnet arrangement more difficult. Hence, it is preferred if r/p is less than or equal to 5. If all these limitations are included they define a region in FIGS. 7A and 8A in which acceptable turn geometries may be obtained. This acceptable region may be defined as: 0.2≦p/r≦2, more preferably 0.4≦p/r≦1.75 and most preferably 0.6≦p/r≦1.5. These regions define an end loop 49 which is rather spoon-shaped.

Figure 9E:
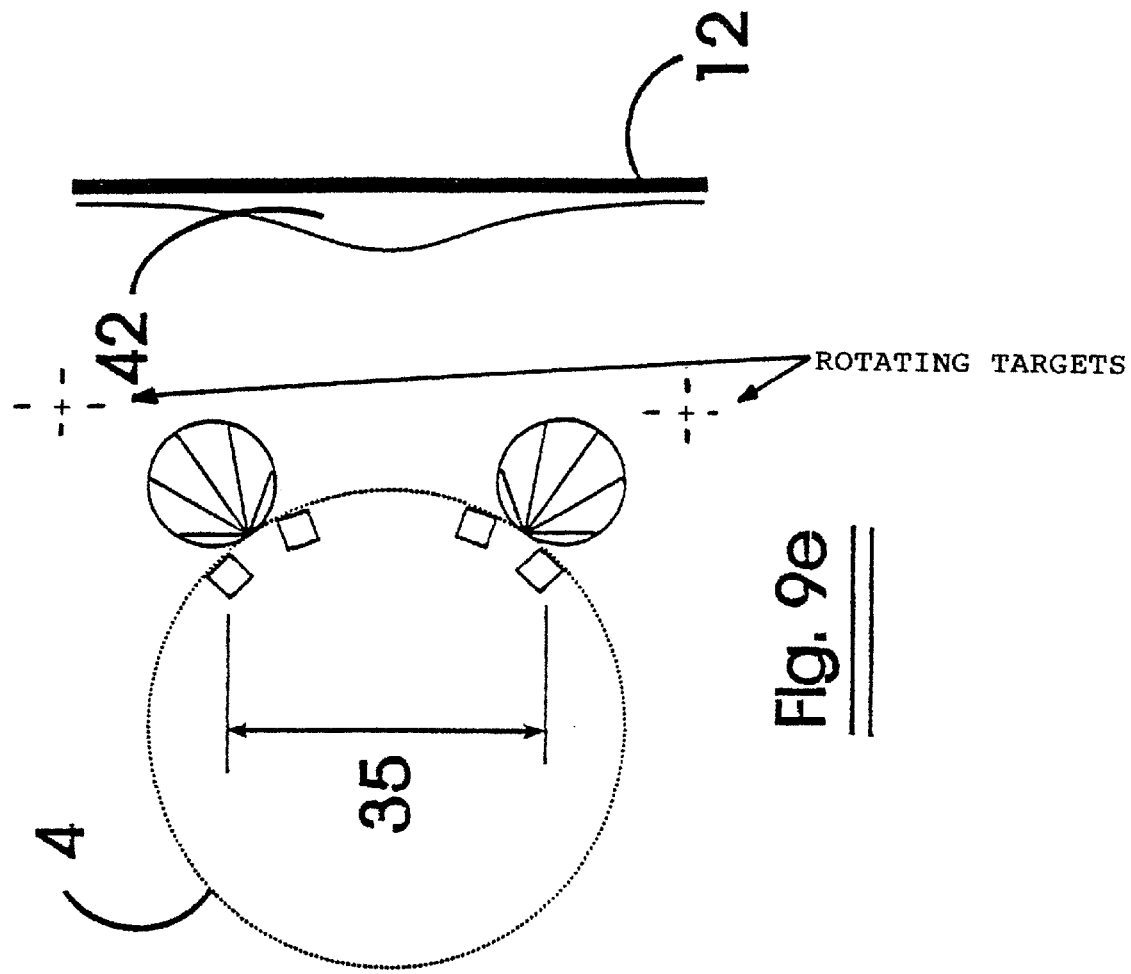
Figure 9B:
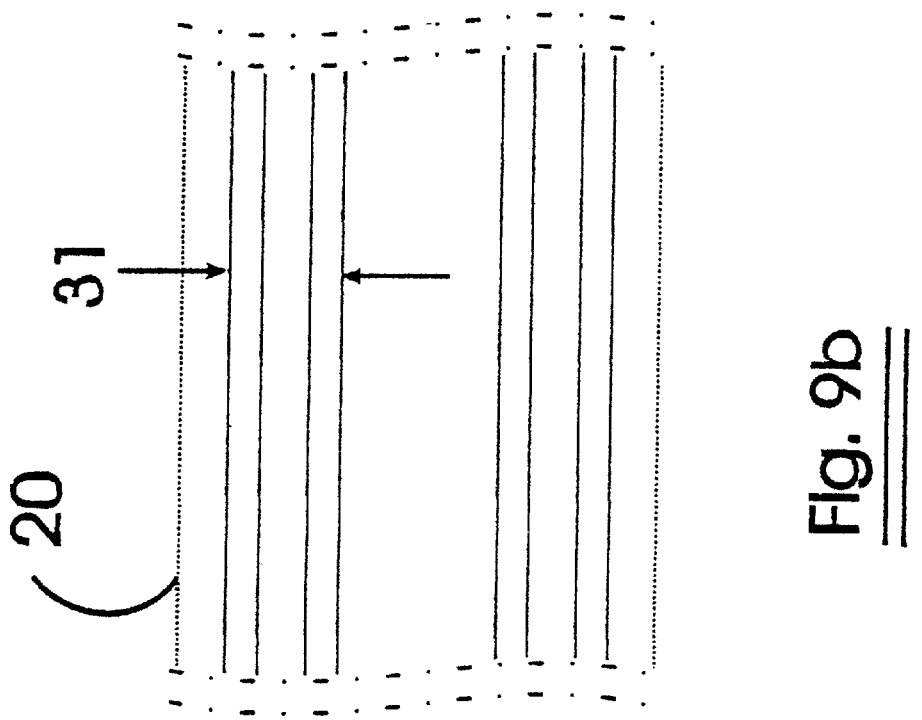

FIGS. 9a–e are schematic representations of a further embodiment in accordance with the present invention. Reference numbers in FIGS. 9a–e which are the same as in FIGS. 4 and 5 refer to similar components. FIGS. 9a–c show top-view representations of a part of the central substantially parallel section 28, the magnet tracks 22, 24 are widened to an overall width of 35 which is larger than the width 33 of the adjacent section. The width 31 between the magnets 22, 24 may remain the same. The effect of this local variation is portrayed schematically in FIGS. 9d and 9e. In the section having an overall width 33, as shown in FIG. 9a, the sputtering direction is mainly perpendicular to the substrate 12. This results in a localised thick sputtered layer 42 on substrate 12. As substrate 12 is moved in a direction perpendicular to the axis of the target 4, the coating 40 is deposited along the length of substrate 12. As shown schematically in FIG. 9e, the direction of sputtering created by the wider width 35 magnet array 20 is inclined at an angle to a perpendicular to the substrate 12. This results in a flatter deposition profile 42 on the substrate 12. Further, some of the sputtered target material may not reach the substrate 12 but is sputtered onto the inside of the vacuum chamber 2 or more preferably onto further, rotating targets arranged on each side of target 4 and parallel thereto. The average erosion of the rotating target 4 remains the same in both the situations depicted in FIGS. 9d and 9e. The longitudinal thickness profile of the deposited layer 42 is shown in FIG. 9f. This example shows a symmetrical spacing although the present invention is not limited thereto.

Figure 10A:
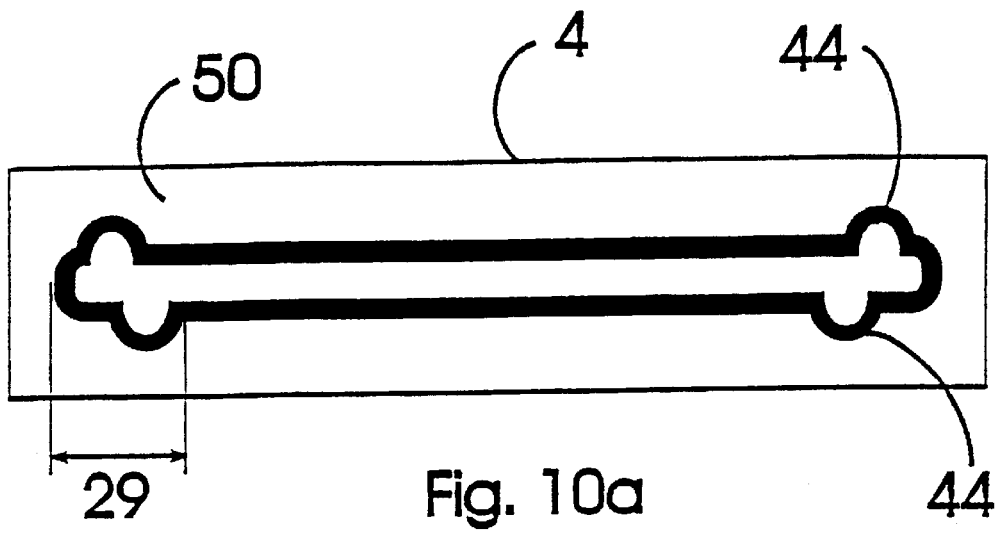
FIG. 10A shows a further race-track form in accordance with the present invention.
Figure 10B:
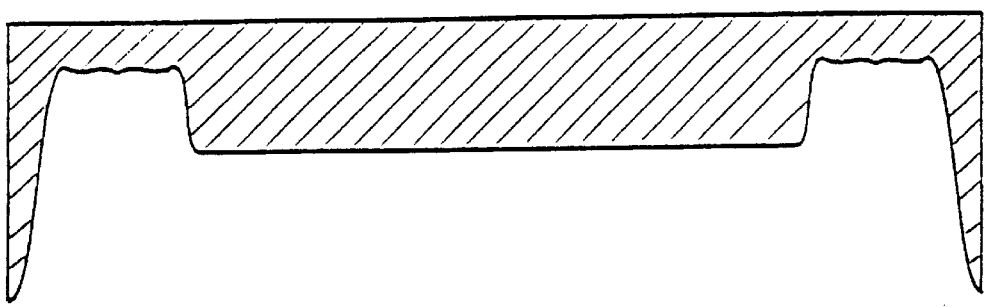
FIGS. 10B and 10C show, respectively, the sputtered material efficiency and the layer thickness profile achieved with the magnet assembly of FIG. 10A.
Figure 10C:
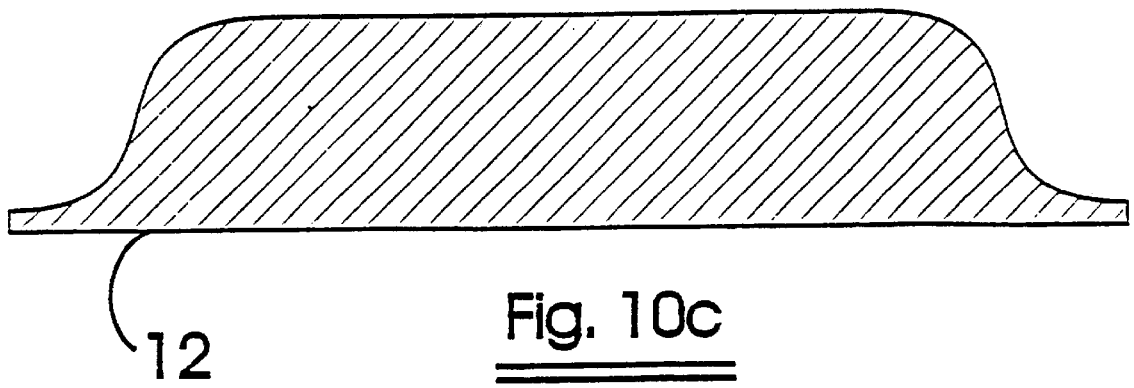

FIGS. 10a–c are schematic representations of yet another embodiment in accordance with the present invention. Reference numbers in FIGS. 10a–c which are the same as in FIGS. 4 and 5 represent similar components. In this embodiment, one or more asymmetrical protrusions of the magnet array 20 are provided adjacent the end of the substantially parallel portion 28, just before or within the end loop region 29 in order to produce local protrusions 44 in the race-track. The effect of these protrusions 44 is to increase locally the amount of sputtered material from the target 4 to the substrate 12, i.e. to increase the deposition rate locally.

Figure 11A:
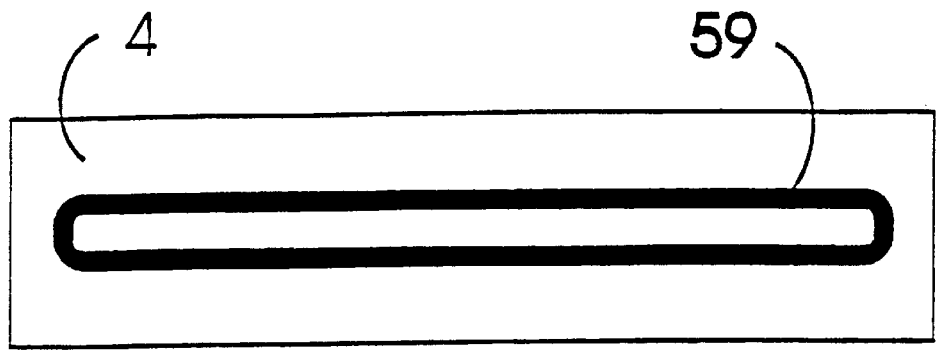
FIGS. 11a to 11c are representations of the race-track form, sputtered efficiency and layer thickness profile for a conventional race-track.
Figure 11B:
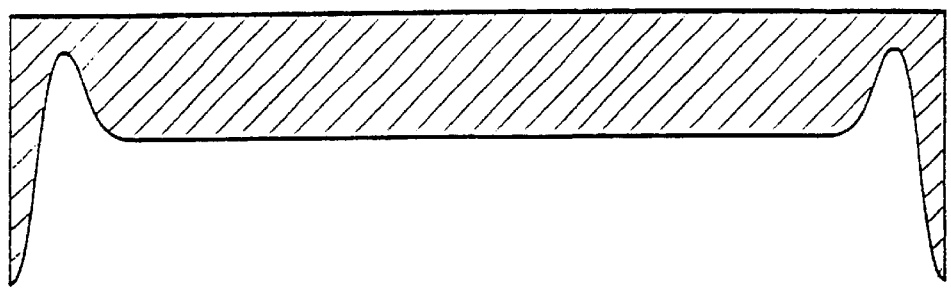
Figure 11C:
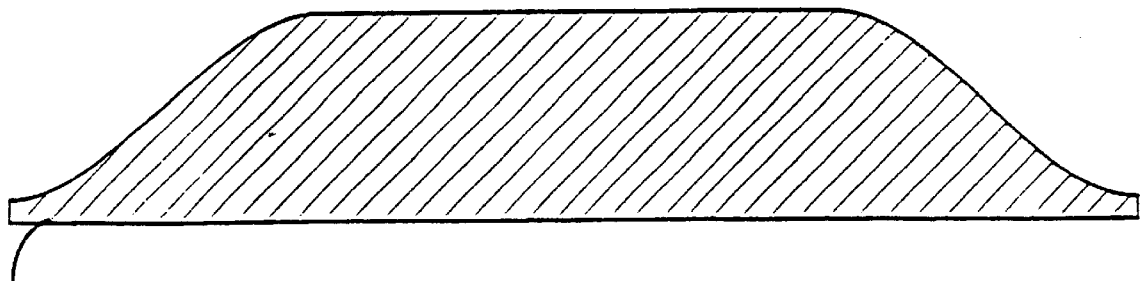

An application of the embodiment shown in FIGS. 10a–c will be compared with reference to FIG. 11. In FIG. 11a a conventional elongate race-track 59 for a rotating cathode magnetron is shown. In FIG. 11b the conventional target erosion profile for the race-track of FIG. 11a is shown. The erosion is deeper at the ends of the race-track 59 in the turn. FIG. 11c shows the deposition layer thickness on the substrate 12. Due the fact that the sputtering is not perfectly perpendicular to the target 4 but is distributed over an angle, the deposition rate at the ends of the race-track is reduced as some of the target material is sputtered away from the substrate. This results in a lowering of the deposition thickness at the ends of the target.

The target erosion profile and deposition thickness profile produced with the arrangement shown in FIG. 11a is shown in FIGS. 11b and 11c respectively. By adding the protrusions 44, the amount of material deposited at the ends of the race-track is increased resulting in a more square deposition profile in FIG. 11c. On the other hand the length of target having increased target erosion is also increased as shown in FIG. 11b. The increased target erosion can be compensated by using replaceable end-pieces for the target 4 which are replaced more often than the central region of the target or by increasing the material thickness of the target at the ends thereof.

In the embodiments of the invention described with reference to FIGS. 4 to 21, the magnet assembly 20 has been shown as if formed from a smooth curvilinear structure. In accordance with the present invention, the magnet assembly 20 may be formed by lumped magnets. It is preferred in accordance with the present invention if the commercially available high powered, hard and generally brittle and almost unworkable magnets conventionally used in magnetrons are combined with specially shaped soft magnetic materials such as iron to provide enhanced curvilinear geometries for the magnetic assembly 20. Soft magnetic materials, e.g. soft iron, in combination with permanent magnets may be used in accordance with the present invention in magnetrons generally and this advantageous combination is not limited to rotating target magnetrons.

Examples of suitable combinations of magnets and soft magnetic materials are shown schematically in FIGS. 12 to 15. FIGS. 12A to C show three schematic and illustrative examples of such suitable magnet arrangements in cross-section. Each consists of at least one permanent magnet 60 and a soft magnetic material 62. As shown in FIG. 12A, an electromagnet or a permanent magnet 60 may be placed inside and in contact with a U-shaped soft magnetic material 62. The central magnet 60 has one pole, e.g. the north pole, directed upwards towards the target and the other poles are generated by the soft magnetic material 62. Such an arrangement can replace two rows of conventional magnets. As shown in FIG. 12B, the magnet 60 may be placed between two soft magnet forms 62, 64, e.g. two U-shaped channels of differing sizes, thus replacing two rows of conventional magnets. FIG. 12C shows three permanent magnets 60, 66, 68 and a shaped soft magnet 62 forming intermediate poles. Such a magnet array can create a plurality of plasma zones generated by the magnetic field between the various pairs of north and south poles.

The advantages of the use of shaped soft magnetic materials are as follows:

1) The volume and/or number of permanent magnets can be reduced to about half of that used conventionally.
2) The array or arrays of permanent magnets can be mounted easily on the soft magnetic material which itself can be easily secured to the magnetron. The sides of the soft magnet materials are rigid and integral with the rest so that no special fixing or stabilisation is required therefore.
3) Curvilinear race-tracks can be generated more easily and more precisely. The soft magnetic material, e.g. soft iron, can be machined, forged, welded etc. and can take on any desired shape. This allows smooth bends and turns rather than the castellated turns of conventional arrangements. This allows more complex race-track shapes such as ellipses or parabolas. The central permanent magnet may remain in the lumped form but it is easier to create a suitable central form with lumped magnets than a smooth outer form.
4) The soft magnetic material may be segmented at appropriate places and the segments driven back and forwards allowing dynamic modification of the race-track form.

Figure 12A:
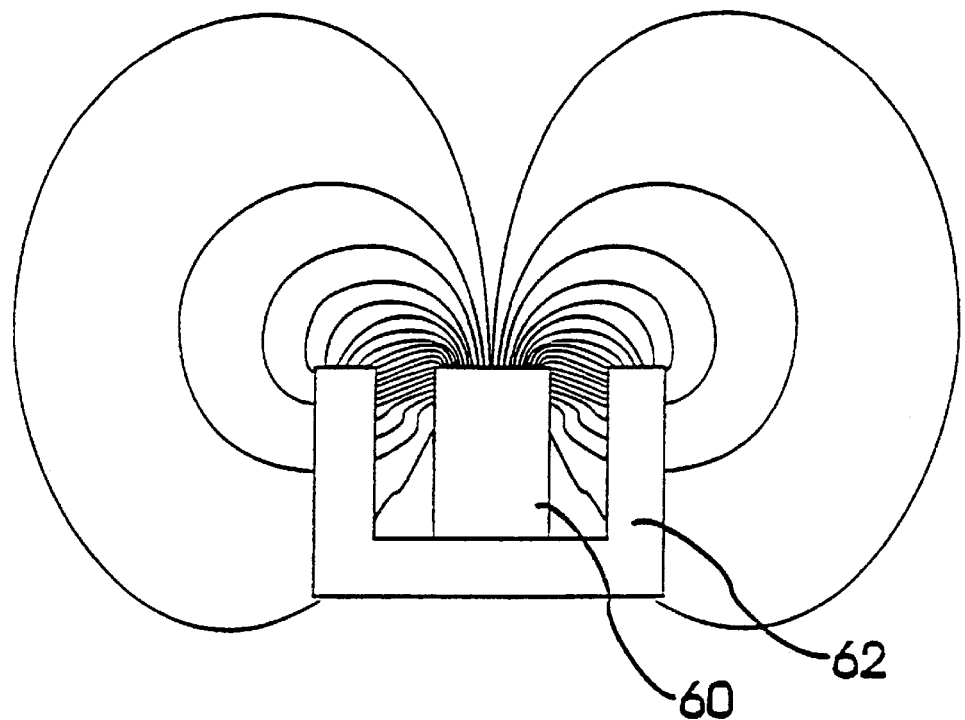
FIGS. 12A to 12C show further magnet assemblies in accordance with the present invention including soft magnetic materials.
Figure 12B:
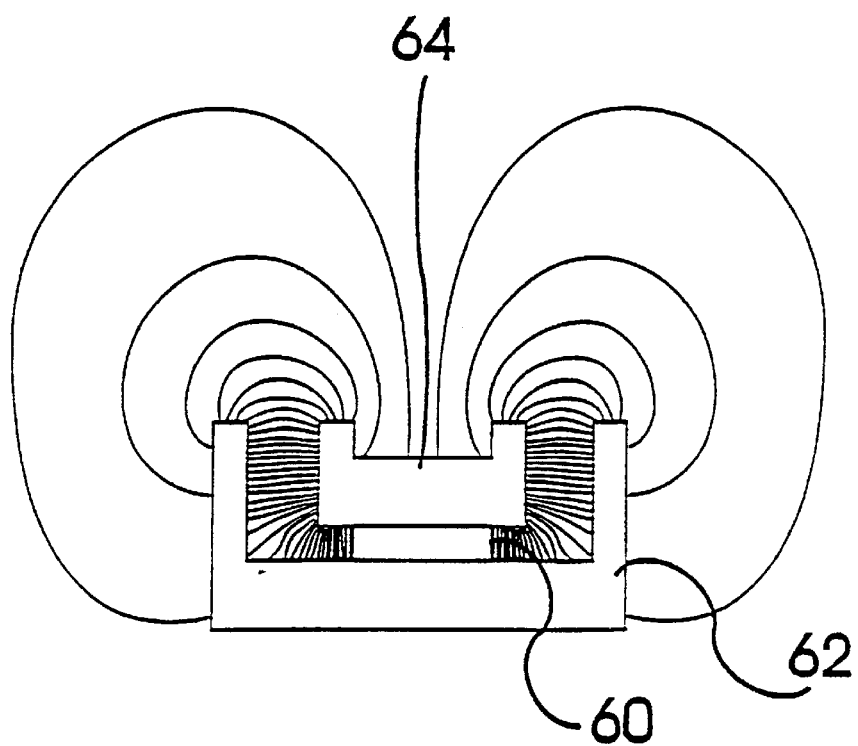
Figure 12C:
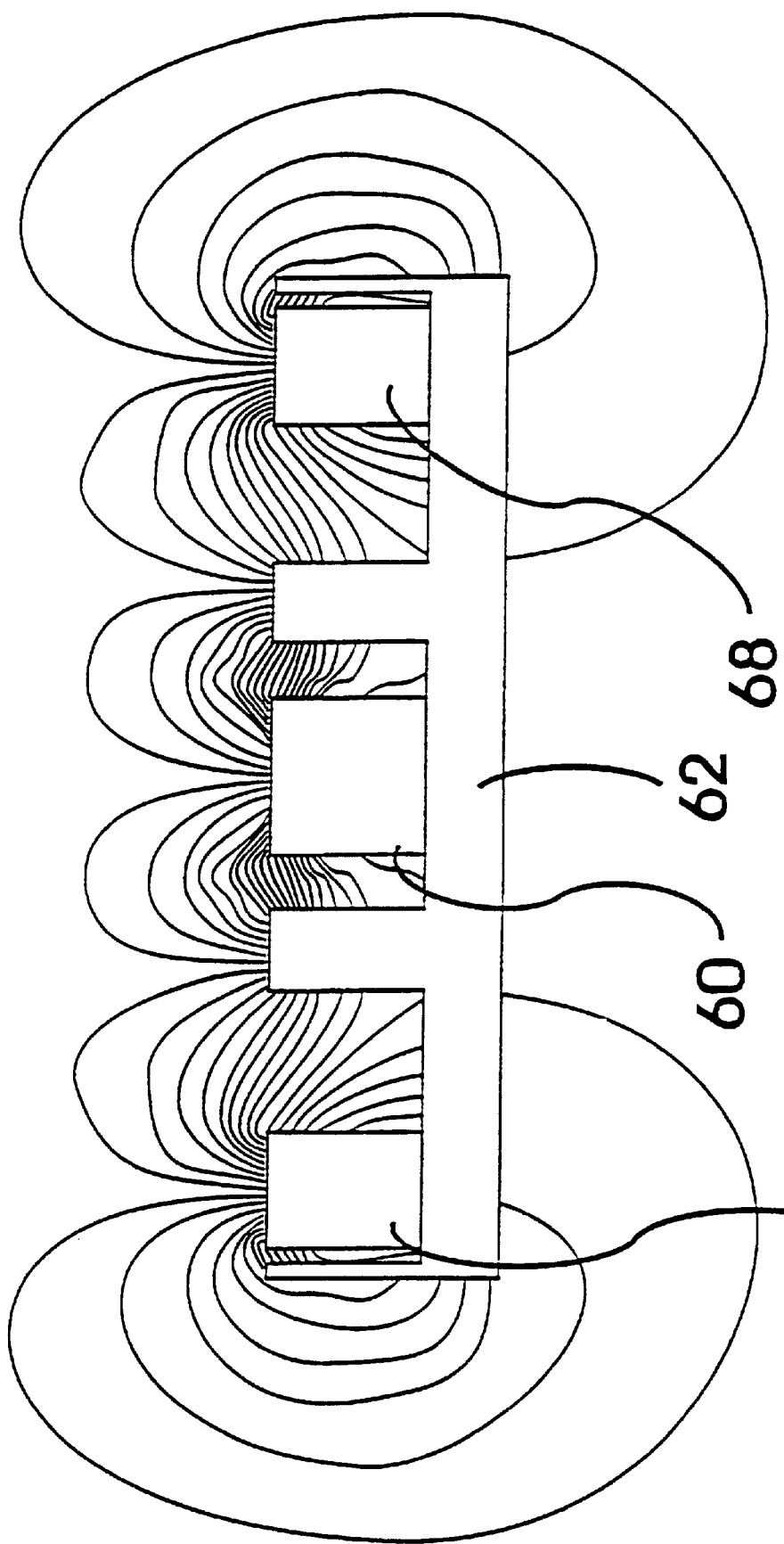

The present invention includes modifications to the basic structures shown in FIGS. 12A to C which are nonlimiting. For instance, the spacing between the pole or poles generated in the soft magnetic material and the pole or poles of the permanent magnets can be varied at will. Further, the height of the vertical sections of the soft magnetic material can be changed at will to modify the magnetic field generated.

Figure 13:
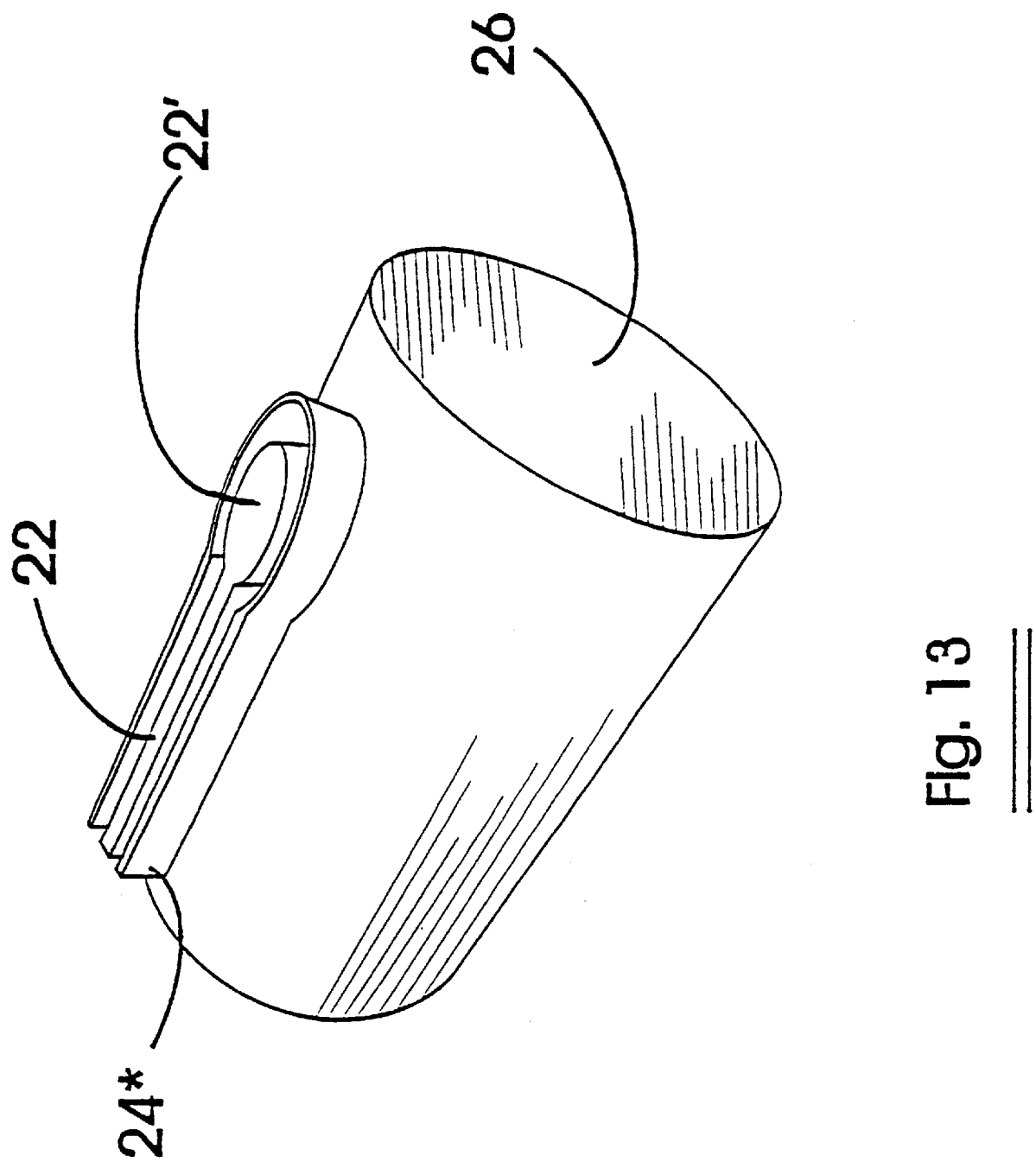
FIGS. 13 to 15 show further preferred magnet assemblies in accordance with the present invention.

FIG. 13 shows part of a preferred arrangement for the magnet assembly shown schematically in FIG. 4. The central permanent magnet array 22 is provided by a series of rectangular magnets arranged in a line terminated by a substantially circular or elliptical magnet 22' to form the end turn. These magnets are secured to an outer U-shaped soft magnetic material 24* which is shaped to provide the outer poles 24, in particular a smooth turn at the ends. The soft magnetic material 24* is secured to the support cylinder 26.

Figure 14:
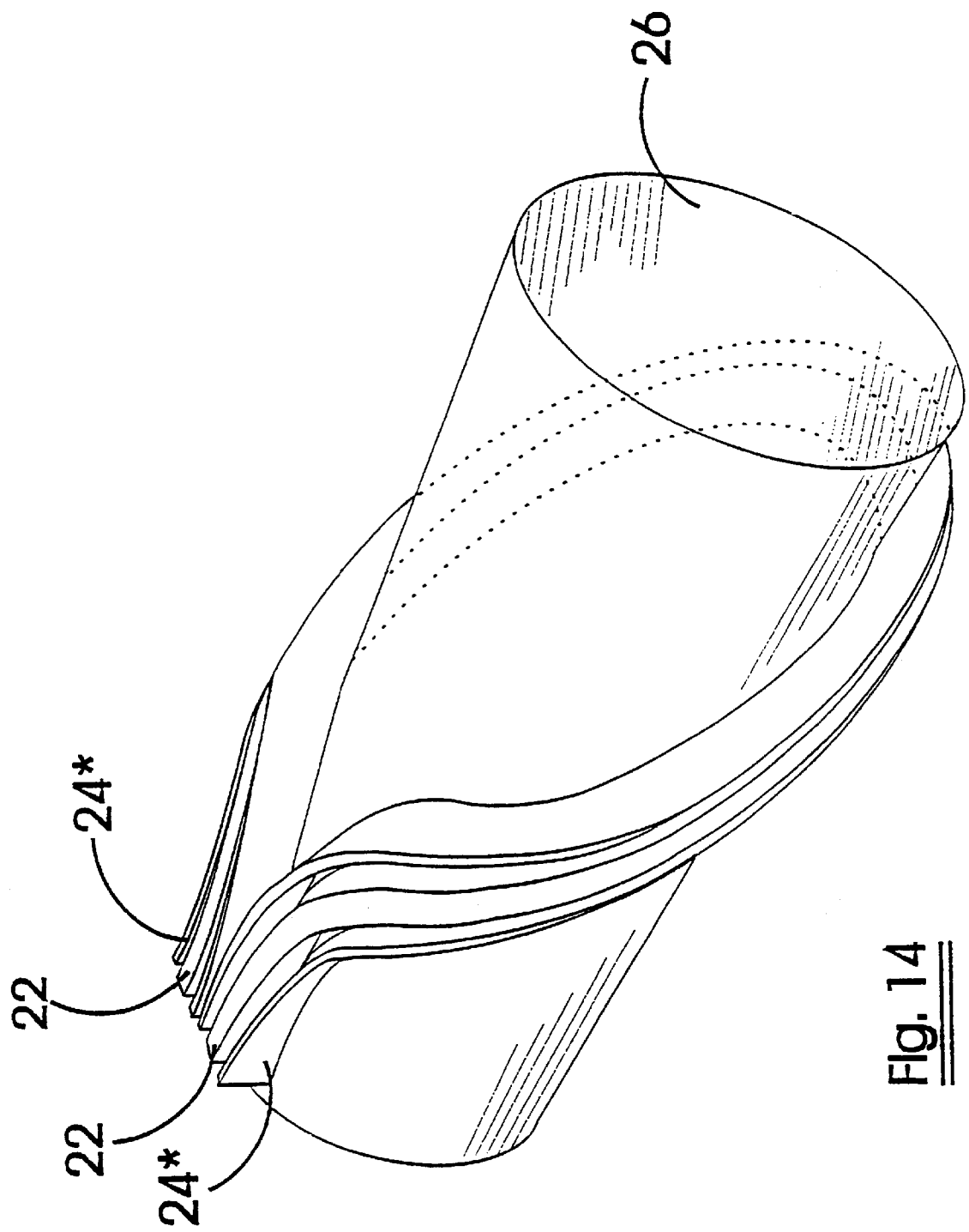

FIG. 14 shows part of a preferred arrangement of the magnet assembly shown in FIG. 5. The end turn is very large in size and the race-track goes right around the target cylinder in the end turn. A single line of permanent magnets 22 are secured within a U-shaped soft magnetic former 24* which provides the other pole 24. The soft magnetic material 24* is fixed to the support tube 26 which is shown transparent for clarity purposes. As the radii are very large, the gaps between the discrete permanent magnets 22 are small. The individual magnets making up the line 22 may be set into specially machined flat sections of the base of soft magnetic material 24* in order to reduce edges and discontinuities between the magnets of lines 22 caused by the curvature of tube 26. This configuration creates a double closed race-track (one inside the other) with opposite electron movement.

Figure 15:
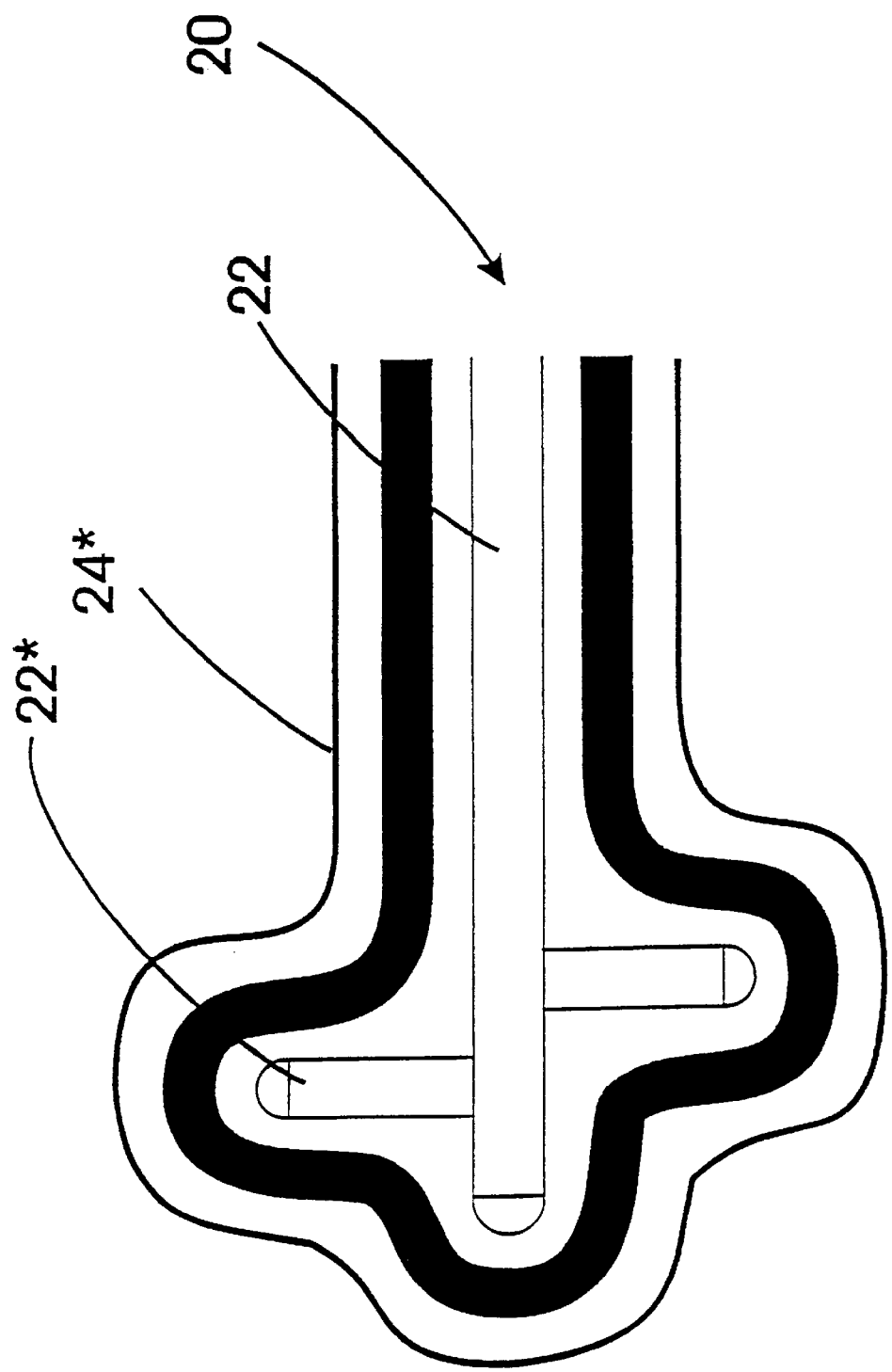

FIG. 15 shows an end part of a preferred arrangement for the magnet assembly shown schematically in FIG. 10. Permanent magnets 22 are arranged in a line to generate, in combination with outer U-shaped soft magnetic material 24* a central substantially parallel section of the race-track 50 Further permanent magnets 22* are arranged perpendicular to the main central portion 22. These magnets are placed within a U-shaped soft magnetic former 24* having graceful outer curves, generating a race-track of the form shown in FIG. 10A with local protrusions 44 near the ends.

While the invention has been shown and described with reference to preferred embodiments, it will be understood by those skilled in the art that various changes or modifications in form and detail may be made without departing from the scope and spirit of this invention.

What is claimed is:

1. A sputtering magnetron with a rotating cylindrical target and a stationary magnet assembly, said magnet assembly being adapted to produce an elongate plasma race-track on a surface of said target, said elongate race-track having substantially parallel tracks over a substantial portion of its length and being closed at each end by end portions, wherein each end portion of the plasma race-track is representable substantially by an ellipse and a spacing between the tracks of said race-track across said ellipse in a first direction perpendicular to a longitudinal axis of the elongate racetrack is larger than the distance between the substantially parallel tracks along a direction parallel to the first direction to materially effect sputtering onto a substrate.

2. The magnetron according to claim 1, wherein said magnet assembly further comprises: an elongated central section positioned within said cylindrical target and generating a magnetic field associated with a first magnetic polarity; a peripheral section positioned within said cylindrical target and being arranged around said elongated central section such that spaces are defined between said peripheral section and said elongated central section, said peripheral section generating a magnetic field associated with a second magnetic polarity; wherein said elongated central section and said peripheral section define a magnetic field suitable for enclosing said racetrack; and wherein said magnetron further comprises: means for causing relative rotation between the cylindrical target and said magnet assembly.

3. A magnetron according to claim 2 wherein the ellipse has a radius "p" and a radius "r" in the directions perpendicular and parallel to the first direction, respectively and a width of the track of the race-track in at least the middle of an end portion being represented by "s", the dimensions "s", "p" and "r" being chosen in a pre-determined relationship to each other in combination with the magnet field strengths and magnetic materials used in said central section and/or said peripheral section of the magnet assembly and the distance between the central and/or the peripheral section and the target to render the target erosion in the end portions substantially uniform.

4. A magnetron according to claim 3 wherein the width of the erosion groove caused by the race-track in the target is less than 1.5r.

5. A magnetron according to claim 3 wherein the ratio p/r is defined by $0.2 \leq p/r \leq 2$, more preferably $0.4 \leq p/r \leq 1.75$ and most preferably $0.6 \leq p/r \leq 1.2$.

6. A magnetron according to claim 3, wherein the width of the erosion groove caused by the race-track in the target is less than 1.2r.

7. A magnetron according to claim 3, wherein an erosion depth of the target in the peripheral section is between +20% and 0% more than an erosion depth of the target in the central section.

8. A magnetron according to claim 1 wherein the spacing between the tracks in the portion of the race-track having parallel tracks is varied locally.

9. A magnetron according to claim 8, wherein the spacing is varied so that a portion of material sputtered from the target is sputtered onto a further rotating cylindrical target located adjacent to said rotating cylindrical target.

10. A magnetron according to any of the claim 2 wherein one of the central and peripheral sections includes at least one magnet and the other of the central and peripheral sections includes a soft magnetic material forming a magnetic circuit with said magnet.

\* \* \* \* \*